United States Patent
Tashima et al.

[19]

[11] Patent Number: 5,842,257
[45] Date of Patent: Dec. 1, 1998

[54] APPARATUS FOR AND METHOD OF FABRICATING SEMICONDUCTOR DEVICES

[75] Inventors: Takahiro Tashima; Hideji Aoki, both of Tokyo, Japan

[73] Assignee: Mitsubishi Denki Kabushiki Kaisha, Tokyo, Japan

[21] Appl. No.: 571,594

[22] Filed: Dec. 13, 1995

[30] Foreign Application Priority Data

Feb. 7, 1995 [JP] Japan ..................................... 7-019136
May 8, 1995 [JP] Japan ..................................... 7-109615

[51] Int. Cl.$^6$ ........................... H01L 21/56; H01L 21/58; H01L 21/60; H01L 21/70
[52] U.S. Cl. ........................ 29/25.01; 438/112; 438/113; 264/272.17
[58] Field of Search ............................ 29/25.01; 438/112, 438/113; 264/272.17

[56] References Cited

U.S. PATENT DOCUMENTS

| 4,624,358 | 11/1986 | Satou . |
| 5,032,542 | 7/1991 | Kazami et al. . |
| 5,614,441 | 3/1997 | Hosokawa et al. . |
| 5,637,273 | 6/1997 | Goo . |

FOREIGN PATENT DOCUMENTS

| 297 02 613 | 6/1997 | Germany . |
| 62-114732 | 5/1987 | Japan . |
| 62-189899 | 12/1987 | Japan . |
| 63-4655 | 1/1988 | Japan . |
| 63-81963 | 4/1988 | Japan . |
| 4 206558 | 7/1992 | Japan . |
| 4-199666 | 7/1992 | Japan . |
| 7-45768 | 2/1995 | Japan . |

*Primary Examiner*—David Graybill
*Attorney, Agent, or Firm*—Oblon, Spivak, McClelland, Maier & Neustadt, P.C.

[57] ABSTRACT

A process wherein a lead frame into which a plurality of semiconductor devices are integrated is first supplied to a press unit (21) among three press units (21 to 23) for cutting, to be cut into the respective semiconductor devices. Thereafter the lead frame is successively fed to the press units (22, 23) in the units of the semiconductor devices due to the action of an internal conveyor (33a), thereby being subjected to cutting stepwise. Thus, the press units (21 to 23) are provided at wide spaces, whereby press motors (85a to 85c) requiring high outputs are independently set for the respective press units (21 to 23). Further, the process does not vary the space between molds with the product pitch of the lead frame. Working is enabled by the press motors which are provided for the respective press units. The process copes with various types of semiconductor devices because the space between the molds may not be changed.

31 Claims, 27 Drawing Sheets

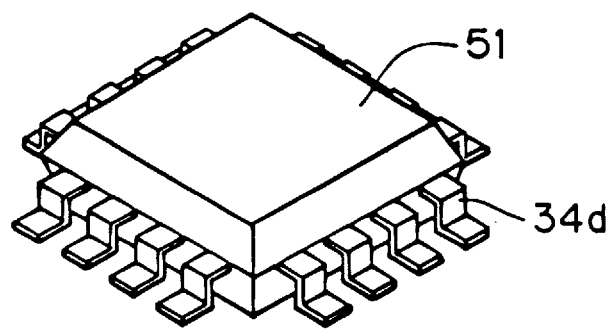
F I G. 19
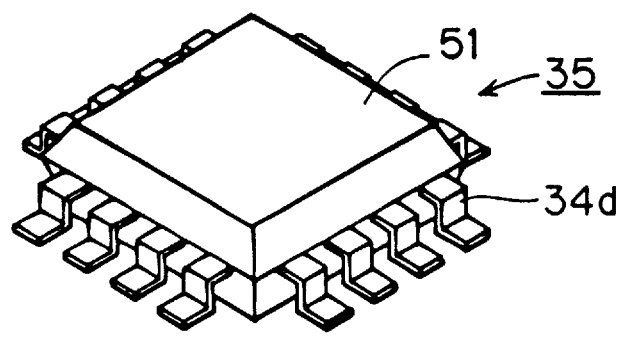
F I G. 20

APPARATUS FOR AND METHOD OF FABRICATING SEMICONDUCTOR DEVICES

BACKGROUND OF THE INVENTION

1. Field of the Invention

The present invention relates to an apparatus and a method for fabricating semiconductor devices, and more particularly, it relates to improvements for coping with various types of semiconductor devices.

2. Description of the Background Art

In an assembling step which is the final one of steps of fabricating semiconductor devices such as LSIs (large-scale integrated circuits), for example, a lead frame which is sealed with resin with semiconductor chips is molded. FIG. 37 is a front elevational view showing a conventional lead molding apparatus 200 which is employed for this purpose.

In this apparatus 200, a lower mold 212 for holding a lead frame 201 from below is mounted on a fixed surface plate 11. Further, an upper mold 210 for holding the lead frame 201 from above is fixed to a movable platen 8. The movable platen 8 slides along the vertical direction, thereby pressing or separating (releasing) the pair of molds 212 and 210 against or from each other.

The upper mold 210 comprises a movable mold body 10 which is fixed to the upper platen 8, and a punch 13 which is mounted on the body 10. On the other hand, the lower mold 212 comprises a fixed mold body 12 which is fixed to the fixed surface plate 11, and a die 14 which is mounted on the body 12. In the respective mold bodies 10 and 12, push rods 10b and 12b for holding the lead frame 201 therebetween are mounted on both sides of the punch 13 and the die 14 while being urged in projecting directions respectively. Further, stopper pins 10a and 12a are mounted on outer sides of the push rods 10b and 12b for protecting the punch 13 and the die 14 against excess clamping force.

The fixed surface plate 11 is fixed onto a frame member 11a which is uprightly provided on a frame 1, and a press surface plate 2 is horizontally mounted on an intermediate stage portion of the side surface of this frame member 11a. A hydraulic unit 3 is placed on the press surface plate 2. Further, the frame member 11a rotatably pivotally supports a crank shaft 4, which is rotated/driven by the hydraulic unit 3, through bearings 4a.

A plurality of connecting shafts 7 are slidably supported by the fixed surface plate 11, so that the upper platen 8 is fixed to forward ends of the connecting shafts 7 by fixing nuts 9 and a lower platen 6 is mounted on lower ends of the connecting shafts 7. A lower end of a connecting rod 5 is swingably supported on the center of the lower platen 6 by a support member 5a. The forward end of the connecting rod 5 is connected to the crank shaft 4, so that the connecting shafts 7 are driven by the hydraulic unit 3 and vertically moved through the crank shaft 4 and the connecting rod 5.

FIGS. 38 to 41 are step diagrams for illustrating movements of the upper and lower molds 210 and 212 in lead molding. In a standby state of the apparatus 200, the upper mold 210 which is mounted on the lower surface of the upper platen 8 is held at a certain constant space from the lower mold 212 which is provided on the fixed surface plate 11, as shown in FIG. 38. In this state, the lead frame 201 which is resin-molded with semiconductor chips is placed on the lower mold 212.

Then, the hydraulic unit 3 is so driven as to downwardly move the upper platen 8, as shown in FIG. 39. Consequently, the crank shaft 4 is so rotated/moved that this movement is transmitted to the lower platen 6 as a vertical movement (up/down movement) through the connecting rod 5. The connecting shafts 7 which are linked with the lower platen 6 and the upper platen 8 are integrated with each other by the fixed nuts 9, whereby the vertical movement of the lower platen 6 brings a vertical movement of the upper platen 8 as such through the connecting shafts 7. Consequently, the upper and lower molds 210 and 212 approach to each other, to press/hold the lead frame 201 by the push rods 10b and 12b projecting from the mold bodies 10 and 12 respectively.

The downward movement of the upper platen 8 is further continued, whereby the pair of push rods 10b and 12b sink into the mold bodies 10 and 12 while holding the lead frame 201, as shown in FIG. 40. Consequently, the punch 13 provided on the upper mold 210 comes into contact with the lead frame 201 placed on the die 14 which is provided on the lower mold 212.

The upper platen 8 is further downwardly moved by a prescribed distance and thereafter stopped, as shown in FIG. 41. Consequently, the lead frame 201 is pressed by the punch 13 and the die 14.

In general, a single lead frame 201 has the so-called multiple structure, in which a plurality of (four or eight, for example) semiconductor devices are arranged at regular intervals. The operation for pressing the lead frame 201 comprises a plurality of cutting steps including tie-bar cutting and a plurality of bending steps including lead shoulder bending, foot bending and the like every semiconductor device. The apparatus 200 is provided with a plurality of pairs of molds 210 and 212 in correspondence to the plural steps, and the spaces therebetween, i.e., the mold pitches, match with the intervals between the plurality of semiconductor devices which are integrated into the lead frame 201, i.e., the product pitches.

The plurality of semiconductor devices which are integrated into the lead frame 201 are first separated from each other at the final stage of the cutting steps. The lead frame 201 is progressed every distance corresponding to the product pitch, and the plurality of upper molds 210 are simultaneously downwardly moved to simultaneously carry out respective pressing steps. The plurality of pairs of molds 210 and 212 are simultaneously driven by a single driving source since the same must be arranged at narrow spaces corresponding to those of the product pitches.

Due to the aforementioned structure, the conventional apparatus 200 has the following problems: First, the molds 210 and 212 must be varied with the types of the semiconductor devices, since the cutting steps are carried out on the semiconductor devices which are integrated in the lead frame 201. Further, the mold pitches must also be varied in response to the product pitches which are generally varied with the types of the semiconductor devices. Thus, much labor and high costs are required for handling a number of types of semiconductor devices.

The mold pitches must be set at narrow spaces corresponding to the product pitches as described above, since the cutting steps are carried out on the semiconductor devices which are integrated in the lead frame 201. Therefore, the plurality of pairs of molds 210 and 212 must be simultaneously driven by a single driving source. Consequently, it is difficult to carry out precise pressing in response to the types of the semiconductor devices and the steps.

While a number of lead frames 201 are successively supplied to the apparatus 200 in a mass production line, such a number of lead frames 201 are generally successively carried at spaces corresponding to the product pitches.

Dimensions of each lead frame 201 are so set that an end of the lead frame 201 along the carriage direction is positioned at a distance half the product pitch from the central point of a semiconductor device which is most approximate to this end.

When the space between the lead frames 201 is zero, i.e., when the ends are butted against each other, the distance between the semiconductor devices which are most approximate to the butted ends also matches with the product pitch. In this case, the space between each adjacent pair of semiconductor devices matches with the product pitch not only in one lead frame 201 but in adjacent lead frames 201.

Due to tolerance between outer dimensions of the lead frames 201, however, adjacent ends may overlap with each other when the spaces between the semiconductor devices are made constant. In order to avoid this, a number of lead frames 201 are generally successively carried at spaces corresponding to the product pitches, as hereinabove described. In this case, however, the plurality of pairs of molds 210 and 212 corresponding to the plurality of pressing steps may include that having no workpiece. Thus, the working efficiency is reduced.

Since the plurality of pairs of molds 210 and 212 are driven by a common driving source, loads which are applied to the respective pairs of molds 210 and 212 deviate from each other to cause offset loads. Such offset loads lead to irregular drafts of the products and damages of the punches 13 and the dies 14.

SUMMARY OF THE INVENTION

According to a first aspect of the present invention, an apparatus for fabricating semiconductor devices which is adapted to press work a lead frame formed by integrally connecting a plurality of elemental leads each serving as a material for the lead of a single semiconductor device with each other while completely being sealed together with semiconductor chips mounted thereon comprises a plurality of press working means, and each of the plurality of press working means comprises at least a pair of molds carrying out press working on the lead frame by holding and pressing the same, while the apparatus further comprises conveyor means for successively transferring the lead frame in units of the elemental leads to a plurality of prescribed portions including portions, receiving the lead frame, of a plurality of pairs of molds from an initial stage to a final stage belonging to the plurality of press working means, the initial stage of the plurality of pairs of molds carries out press working of separating the lead frame into the respective elemental leads by cutting the lead frame, the conveyor means successively transfers the lead frame in units of the elemental leads to that of those of the plurality of prescribed portions following that belonging to the initial stage of the plurality of pairs of molds, and the lead frame is press worked in units of the elemental leads in stages following the initial stage of the plurality of pairs of molds.

According to a second aspect of the present invention, each of the plurality of press working means further comprises a press power source applying pressing force to the said at least a pair of molds.

According to a third aspect of the present invention, the apparatus for fabricating semiconductor devices further comprises control means, and the control means controls the press power source so that each of the plurality of press working means carries out press working in correspondence to type and structure of the semiconductor devices on the basis of a previously provided variety signal expressing information on the type and structure.

According to a fourth aspect of the present invention, each of the plurality of press working means comprises driving means for driving the press power source, and the control means transmits a signal indicating press working conditions to the driving means, while the driving means drives the press power source to satisfy the press working conditions on the basis of the signal.

According to a fifth aspect of the present invention, the apparatus for fabricating semiconductor devices further comprises thickness detection means detecting the thickness of the lead frame and transmitting a signal expressing the thickness to the control means, and the control means controls the press power source so that each of the plurality of press working means carries out the press working in correspondence to the type, the structure and the thickness on the basis of the variety signal and the signal.

According to a sixth aspect of the present invention, the apparatus for fabricating semiconductor devices further comprises loading means for supplying the lead frame from a storage vessel receiving the lead frame to the initial stage of the plurality of pairs of molds, wherein a recording medium recording the type of the semiconductor devices is attached to the storage vessel, the loading means comprises read means for reading the type which is recorded in the recording medium and transmitting a signal expressing the type to the control means, and the control means compares the variety signal with the signal thereby deciding whether or not the type of the lead frame which is received in the storage vessel is erroneous and displaying the result.

According to a seventh aspect of the present invention, the press power source comprises an electric rotary motor generating torque, and means for converting the torque of the electric rotary motor to the pressing force which is applied to the said at least a pair of molds by a ball screw which is directly connected to a rotary shaft of the electric rotary motor.

According to an eighth aspect of the present invention, the conveyor means comprises an arm for supporting and transferring the elemental leads by sucking the surface of a sealing body sealing the semiconductor chips.

According to a ninth aspect of the present invention, the conveyor means comprises guide means for guiding the sealing body to be capable of supporting the elemental leads on a prescribed portion of the arm.

According to a tenth aspect of the present invention, the plurality of pairs of molds repetitively carry out pressing and releasing in synchronization with each other, and the conveyor means repetitively simultaneously transfers a plurality of the elemental leads which are placed on the plurality of prescribed portions every released period of the plurality of pairs of molds.

According to an eleventh aspect of the present invention, the number of the plurality of prescribed portions is at least 3, and the plurality of prescribed portions are arranged on a straight line at regular intervals.

According to a twelfth aspect of the present invention, an apparatus for fabricating semiconductor devices which is adapted to carry out press working on a lead frame completely being sealed together with semiconductor chips mounted thereon comprises a plurality of press working means, and each of the plurality of press working means comprises at least a pair of molds carrying out press working on the lead frame by holding and pressing the same, a press power source applying pressing force to the said at least a pair of molds, and driving means for driving the press power source, while the apparatus further comprises control means, the control means transmits a signal indicating press working conditions corresponding to type and structure of the semiconductor devices on the basis of a previously provided variety signal expressing information on the type and structure to the driving means, and the driving means drives the press power source to satisfy the press working conditions on the basis of the signal.

According to a thirteenth aspect of the present invention, an apparatus for fabricating semiconductor devices which is adapted to carry out press working on a lead frame completely being sealed together with semiconductor chips mounted thereon comprises press working means, and the press working means comprises at least a pair of molds carrying out press working on the lead frame by holding and pressing the same, and a press power source applying pressing force to the at least a pair of molds, while the apparatus further comprises control means, and the control means controls the press power source so that the press working means carry out press working in correspondence to type and structure of the semiconductor devices on the basis of a previously provided variety signal expressing information on the type and structure.

According to a fourteenth aspect of the present invention, the apparatus for fabricating semiconductor devices further comprises thickness detection means detecting the thickness of the lead frame and transmitting a signal expressing the thickness to the control means, and the control means controls the press power source so that the press working means carries out the press working in correspondence to the type, the structure and the thickness on the basis of the variety signal and the signal.

According to a fifteenth aspect of the present invention, a method of fabricating semiconductor devices which is adapted to press work a lead frame formed by integrally connecting a plurality of elemental leads each serving as a material for the lead of a single semiconductor device with each other while completely being sealed together with semiconductor chips mounted thereon comprises (a) a step of preparing a plurality of pairs of molds for carrying out press working on the lead frame by holding and pressing the same, including a pair of molds for elemental cutting which are capable of cutting the lead frame to separate the same into the respective elemental leads, and (b) a step of press working the lead frame stepwise by successively employing the plurality of pairs of molds, and the step (b) comprises (b-1) a step of cutting the lead frame to separate the same into the respective elemental leads by employing the pair of molds for elemental cutting in advance of all other press working.

According to a sixteenth aspect of the present invention, a method of fabricating semiconductor devices which is adapted to press work a lead frame completely being sealed together with semiconductor chips mounted thereon comprises (a) a step of preparing at least a pair of molds which are capable of carrying out press working on the lead frame by holding and pressing the same, and (b) a step of press working the lead frame by pressing the said at least a pair of molds for implementing press working corresponding to the type and structure of the semiconductor devices on the basis of information related to the type and structure.

According to a seventeenth aspect of the present invention, the method of fabricating semiconductor devices further comprises (c) a step of detecting the thickness of the lead frame, and the step (b) comprises (b-1) a step of press working the lead frame by pressing the said at least a pair of molds to implement press working corresponding to the type and the structure of the semiconductor devices and the thickness on the basis of the information related to the type and the structure and on the basis of the thickness detected in the step (c).

According to an eighteenth aspect of the present invention, at least one of the plurality of press working means further comprises cleaning means for removing unnecessary substances resulting from press working by cleaning that of the elemental leads which is placed on one of the plurality of prescribed portions.

According to a nineteenth aspect of the present invention, the cleaning means comprises brush means for separating the unnecessary substances from the elemental leads by brushing the elemental leads, and air suction means for sucking the separated unnecessary substances and eliminating the same to the exterior by sucking air around the elemental leads which are subjected to the brushing.

According to a twentieth aspect of the present invention, the apparatus for fabricating semiconductor devices further comprises inspection means for inspecting whether or not press working is normally carried out on that of the elemental leads which is placed on at least one of the plurality of prescribed portions while selecting the elemental leads in response to the results of the inspection.

According to a twenty-first aspect of the present invention, one of the said at least a pair of molds provided in each of the plurality of press working means is of a fixed type and the other one is of a movable type, and each of the plurality of press working means further comprises a drive shaft which is provided with the pressing force by the press power source, a fixed mold holder fixing the fixed mold of the said at least a pair of molds, a plurality of guide posts which are uprightly provided on the fixed mold holder, a movable mold holder which is slidably supported by the plurality of guide posts for fixing the movable mold of the said at least a pair of molds, a shank comprising a shaft member projecting from the forward end of the drive shaft in the form of a bar and a flange member which is connected to the forward end portion of the shaft member and having a substantially semispherical top portion, and a shank holder which is fixedly mounted on the movable mold holder and having an elongated recess having an open end, so that the shaft member is inserted in the recess for engaging the flange member with a peripheral edge portion of the recess, while the plurality of guide posts being set only on one side about a virtual plane include that of the plurality of prescribed portions belonging to the said at least a pair of molds and parallel to the direction of the pressing force.

According to a twenty-second aspect of the present invention, an apparatus for fabricating semiconductor devices which is adapted to carry out press working on a lead frame completely being sealed together with semiconductor chips mounted thereon by holding the same between fixed and movable molds and pressing the same comprises a fixed mold holder capable of receiving the fixed mold, a movable mold holder capable of receiving the movable mold, a support member which is opposed to the fixed mold holder through the movable mold holder and fixedly connected to the fixed mold holder through a connecting member, and a plurality of guide posts slidably supporting the movable mold holder on the support member in a direction opening/closing the fixed mold which is mounted on the fixed mold holder and the movable mold which is mounted on the movable mold holder, the connecting member being set only on one side about a virtual plane includes portions of the fixed mold which is mounted on the fixed mold holder and the movable mold which is mounted on the movable mold holder receiving the lead frame and parallel to the opening/closing direction, and the plurality of guide posts are arranged on positions putting the portions therebetween or surrounding the same substantially at a center thereof as viewed along the opening/closing direction, that or those of the plurality of guide posts which are arranged at least on the other side of the virtual plane are not provided between the movable mold holder and the fixed mold holder.

According to a twenty-third aspect of the present invention, the number of the plurality of guide posts is at least 3, and at least two guide posts other than at least one of the plurality of guide posts are arranged on the said one side and fixedly connect the support member and the fixed mold holder with each other for serving also as the connecting member.

According to a twenty-fourth aspect of the present invention, the number of the plurality of guide posts is at least 3, at least two guide posts other than at least one of the plurality of guide posts are arranged on the said one side and fixedly connect the support member and the fixed mold holder with each other, and the connecting member is provided independently of the said at least two guide posts.

According to a twenty-fifth aspect of the present invention, the apparatus for fabricating semiconductor devices further comprises a reinforce for suppressing displacement of the support member, the reinforce has a reinforce body which is fixed to at least one of the said at least two guide posts, and a screw which is fitted with the reinforce body, and the screw is so fitted with the reinforce body that its forward end comes into contact with the support member.

According to the twenty-fifth aspect of the present invention, the apparatus for fabricating semiconductor devices further comprises a reinforce for suppressing displacement of the support member, the reinforce has a reinforce body which is fixed to at least one of the said at least two guide posts, and a screw which is fitted with the reinforce body, and the screw is so fitted with the reinforce body that its forward end comes into contact with the support member.

According to a twenty-sixth aspect of the present invention, the fixed mold holder, the connecting member and the support member are integrally molded with each other.

According to a twenty-seventh aspect of the present invention, the apparatus for fabricating semiconductor devices further comprises a power source generating power for applying reciprocation in a direction opening/closing the fixed mold which is mounted on the fixed mold holder and the movable mold which is mounted on the movable mold holder to the movable mold holder, a drive shaft which is supplied with the reciprocation by the power source, and a holder which is mounted on the forward end of the drive shaft, and the holder comprises a mounting plate which is fixed to the forward end of the drive shaft, a lever which is rotatably supported on a side of the mounting plate which is opposite to the drive shaft, and an elastic body urging the lever to rotate the same toward the mounting plate, while the apparatus further comprises a connecting member which is fixedly connected to the movable mold holder and connectable with the holder by being held by the mounting plate and the lever therebetween so that movement of the drive shaft in a direction closing the movable mold and the fixed mold is transmitted to the connecting member through the mounting plate and movement in a direction for releasing the same is transmitted to the same through the lever, and the elastic body urges the lever with force which is sufficient for regularly maintaining the mounting plate in contact with the connecting member in reciprocation of the drive shaft.

According to a twenty-eighth aspect of the present invention, the support member is provided with an opening which is capable of freely receiving the drive shaft.

According to a twenty-ninth aspect of the present invention, the opening is formed in a shape which is capable of passing the holder being connected with the connecting member therethrough.

According to a thirtieth aspect of the present invention, the fixed mold holder is provided with a first groove which is engageable with the fixed mold, the fixed mold which is engaged with the first groove is fixed to the fixed mold holder by a detachable fastening member, the movable mold holder is provided with a second groove which is engageable with the movable mold, and the movable mold which is engaged with the second groove is fixed to the movable mold holder by a detachable fastening member.

In the apparatus according to the first aspect of the present invention, the lead frame is first separated into the respective elemental leads by the molds of the first stage, and molding (press working) is thereafter performed in units of the elemental leads in the molds following the second stage. Therefore, the spaces between the plurality of pairs of molds may not match with product pitches in the lead frame. Consequently, it is not necessary to change the spaces between the molds even if the product pitches in the lead frame are changed due to change of the type of the semiconductor devices to be fabricated etc. Namely, it is possible to fabricate various types of semiconductor devices with small labor at a low cost by employing this apparatus.

In the apparatus according to the second aspect of the present invention, respective ones of the plurality of press working means are independently provided with the press power sources, whereby precise molding suitable for the respective press working means is implemented. Further, the problem of offset loads caused in the conventional apparatus can be solved.

In the apparatus according to the third aspect of the present invention, the control means controls the press power source on the basis of the variety signal, whereby the respective press means operate under proper conditions corresponding to the type of the semiconductor devices. Thus, precise molding is regularly implemented regardless of the type of the semiconductor devices.

In the apparatus according to the fourth aspect of the present invention, the respective ones of the plurality of press working means are independently provided with the drive means for driving the press power sources, whereby it is not necessary to regularly provide drive means which is responsive to the maximum number of press means. Namely, it is possible to freely change arrangement of the press means in response to the type of the semiconductor devices at a small cost. Thus, various types of semiconductor devices can be fabricated with small labor at a low cost.

The apparatus according to the fifth aspect of the present invention is provided with the thickness detection means for detecting the thickness of the lead frame, whereby optimum molding is carried out also in consideration of the thickness of the lead frame in addition to the type and the structure of the semiconductor devices. Namely, precise molding is implemented also in consideration of deviation in thickness of the lead frame.

The apparatus according to the sixth aspect of the present invention displays whether or not the type read by the read means is correct, whereby an erroneous lead frame can be exchanged with a correct one by observing the result of decision as displayed. Namely, the working efficiency can be improved.

In the apparatus according to the seventh aspect of the present invention, the torque generated by the electric rotary motor is converted to pressing force which is applied to at least a pair of molds by the ball screw directly connected with the rotary shaft of the electric rotary motor, whereby no complicated transmission mechanism such as a crank and a gear is required. Thus, precise molding can be readily performed.

In the apparatus according to the eighth aspect of the present invention, the conveyor means comprises the arm transferring the elemental leads by sucking the surface of the sealing body, whereby the elemental leads are safely transferred with neither deformation nor damage.

The apparatus according to the ninth aspect of the present invention is provided with the guide means for guiding the sealing body to a prescribed portion of the arm, whereby the elemental leads are supported on prescribed positions. Thus, the elemental leads are smoothly transferred by the conveyor means.

In the apparatus according to the tenth aspect of the present invention, the plurality of pairs of molds repeat pressing and releasing in synchronization with each other while the conveyor means repetitively simultaneously transfers the plurality of elemental leads which are placed on the plurality of prescribed portions every released period of the plurality of pairs of molds, whereby working efficiency is improved.

In the apparatus according to the eleventh aspect of the present invention, the plurality of prescribed portions which are at least three portions are arranged on a straight line at regular intervals, whereby the conveyor means may not vary its movement with the plurality of elemental leads for transferring the plurality of elemental leads which are placed on the plurality of prescribed portions. Thus, the structure of the conveyor means can be simplified, while efficient transfer is possible.

In the apparatus according to the twelfth aspect of the present invention, the respective ones of the plurality of press working means are independently provided with the drive means for driving the press power sources, whereby it is not necessary to regularly provide drive means which is responsive to the maximum number of press means. Namely, it is possible to freely change the arrangement of the press means in response to the type of the semiconductor devices at a small cost. Thus, various types of semiconductor devices can be fabricated with small labor at a low cost.

In the apparatus according to the thirteenth aspect of the present invention, the control means controls the press power source on the basis of the variety signal, whereby the press means operates under proper conditions corresponding to the type of the semiconductor devices. Thus, precise molding is regularly implemented regardless of the type of the semiconductor devices.

The apparatus according to the fourteenth aspect of the present invention is provided with the thickness detection means for detecting the thickness of the lead frame, whereby optimum molding is carried out also in consideration of the thickness of the lead frame in addition to the type and the structure of the semiconductor devices. Namely, precise molding is implemented also in consideration of deviation in thickness of the lead frame.

In the method according to the fifteenth aspect of the present invention, the lead frame is first separated into the respective elemental leads by the molds of the initial stage, and thereafter molding (press working) is performed in units of the elemental leads in the molds following the second stage. Therefore, the arrangement spaces between the plurality of pairs of molds may not match with the product pitches in the lead frame. Consequently, it is not necessary to change the arrangement spaces between the molds even if the product pitches are changed by change of the type of the semiconductor devices to be fabricated or the like. Namely, it is possible to fabricate various types of semiconductor devices with small labor at a small cost by employing this method.

In the method according to the sixteenth aspect of the present invention, at least a pair of molds are pressed to implement molding (press working) corresponding to the type and the structure of the semiconductor devices on the basis of the information related to the type and the structure, whereby precise molding is regularly implemented regardless of the type of the semiconductor devices.

The method according to the seventeenth aspect of the present invention is adapted to detect the thickness of the lead frame, thereby carrying out optimum molding also in consideration of the thickness of the lead frame in addition to the type and the structure of the semiconductor devices. Namely, precise molding is implemented also in consideration of deviation in thickness of the lead frame.

The apparatus according to the eighteenth aspect of the present invention is provided with the cleaning means for removing the unnecessary substances resulting from molding, whereby it is possible to prevent molding by the molds of the subsequent stages from being inhibited by the unnecessary substances.

In the apparatus according to the nineteenth aspect of the present invention, the unnecessary substances are separated by brushing and efficiently eliminated to the exterior by the air suction means. Thus, no unnecessary substances are stored in the press means.

In the apparatus according to the twentieth aspect of the present invention, defectives and non-defectives are selected by the inspection means, whereby it is possible to prevent unnecessary molding of non-defectives by the molds of the subsequent stages. Further, it is also possible to prevent the products from contamination with non-defectives.

In the apparatus according to the twenty-first aspect of the present invention, the movable mold holder which is slidably supported by the plurality of guide posts slides by pressing force of the drive shaft, whereby the movable mold is pressed against the fixed mold through the lead frame which is the workpiece, thereby implementing molding of the lead frame. The plurality of guide posts are set only on one side (rear portion) about a virtual plane including a prescribed portion belonging to at least a pair of molds and being along the direction of the pressing force, whereby another side (front portion) of the virtual plane is widely ensured as a working region in the clearance between the fixed mold holder and the movable mold holder. Therefore, it is possible to prevent the conveyor means from interfering with the guide posts by setting the conveyor means on the front portion. Further, the ball screw and the movable mold holder are connected with each other due to engagement of the shank and the shank holder which are detachable from each other, whereby the fixed mold and the movable mold can be exchanged in the unit of the overall apparatus connected with the shank holder, i.e., the die set.

In the apparatus according to the twenty-second aspect of the present invention, the movable mold which is slidably supported by the plurality of guide posts are pressed against the fixed mold through the lead frame which is the workpiece, thereby implementing molding (press working) of the lead frame. The connecting member is set on one side (rear portion) of the virtual plane while the guide posts which are arranged on the other side (front portion) are not provided between the movable mold holder and the fixed mold holder, whereby the front portion is widely ensured as a working region in the clearance between the fixed mold holder and the movable mold holder. Therefore, it is possible to readily carry the lead frame which is the workpiece without interfering with the members of the apparatus. Further, the plurality of guide posts are arranged on positions putting the portions of the fixed and movable molds receiving the lead frame therebetween or surrounding the portions, substantially at a center thereof as viewed along the direction of opening/closing of the fixed and movable molds. Therefore, bending moment which is caused in the guide posts when the movable mold is so pressed as to block the movable mold and the fixed mold is eliminated or relaxed. Thus, precise molding is implemented. Further, the apparatus can be brought into a simple ram-free structure.

In the apparatus according to the twenty-third aspect of the present invention, the plurality of guide posts partially also serve as the connecting member, whereby it is not necessary to separately provide the connecting member. Namely, the structure of the apparatus is simple.

In the apparatus according to the twenty-fourth aspect of the present invention, the plurality of guide posts partially also serve as the connecting member while the connecting member is provided independently of the same, whereby the support member and the fixed mold holder are strongly connected with each other. Thus, the support member is inhibited from displacement following pressing of the movable mold holder for blocking the movable mold and the fixed mold, whereby working accuracy is further improved.

The apparatus according to the twenty-fifth aspect of the present invention is provided with the reinforce, whereby the support member is inhibited from displacement following pressing of the movable mold holder for blocking the movable mold and the fixed mold. Thus, working accuracy is further improved.

In the apparatus according to the twenty-sixth aspect of the present invention, the fixed mold holder, the connecting member and the support member are integrally molded with each other, whereby the fixed mold holder and the support member are strongly connected with each other. Therefore, the support member is inhibited from displacement following pressing of the movable mold holder for blocking the movable mold and the fixed mold, whereby working accuracy is further improved.

In the apparatus according to the twenty-seventh aspect of the present invention, the lever and the mounting plate sufficiently strongly urged by the elastic member hold the connecting member for implementing connection between the drive shaft and the movable mold holder, whereby no impact load following reciprocation is caused in the connected portion.

In the apparatus according to the twenty-eighth aspect of the present invention, the opening capable of freely receiving the drive shaft is provided in the support member, whereby the power source can be set on the support member on a side opposite to the movable mold holder. Namely, it is possible to miniaturize the portion of the die set by narrowly setting the space between the support member and the fixed holder, while employing a power source causing high power.

In the apparatus according to the twenty-ninth aspect of the present invention, the opening formed in the support member is in a shape capable of passing the holder which is connected with the connecting member therethrough, whereby the holder connected with the connecting member can be drawn out to the side opposite to the movable mold holder with respect to the support member. Consequently, the holder and the connecting member can be further readily detached from each other.

In the apparatus according to the thirtieth aspect of the present invention, the fixed mold and the movable mold are engaged with the first and second grooves respectively, whereby the same can be readily positioned on the mold holders respectively. Further, the fixed mold and the movable mold are fixed to the respective mold holders by the engageable fastening members, whereby the fixed mold and the movable mold can be exchanged not in units of die sets but in units of the fixed mold and the movable mold.

Accordingly, an object of the present invention is to provide an apparatus for and a method of fabricating semiconductor devices capable of handling various types of semiconductor devices at a low cost and carrying out precise working, having high working efficiency and causing no offset loads.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 19 is a plan view showing a shape change following working of the lead frame;

FIG. 20 is a plan view showing a shape change following working of the lead frame;

DESCRIPTION OF THE PREFERRED EMBODIMENTS

<A. First Embodiment>

First, a semiconductor fabricating apparatus according to a first embodiment of the present invention is described.

<A-1. Overall Structure of Apparatus 100>

Figure 1:
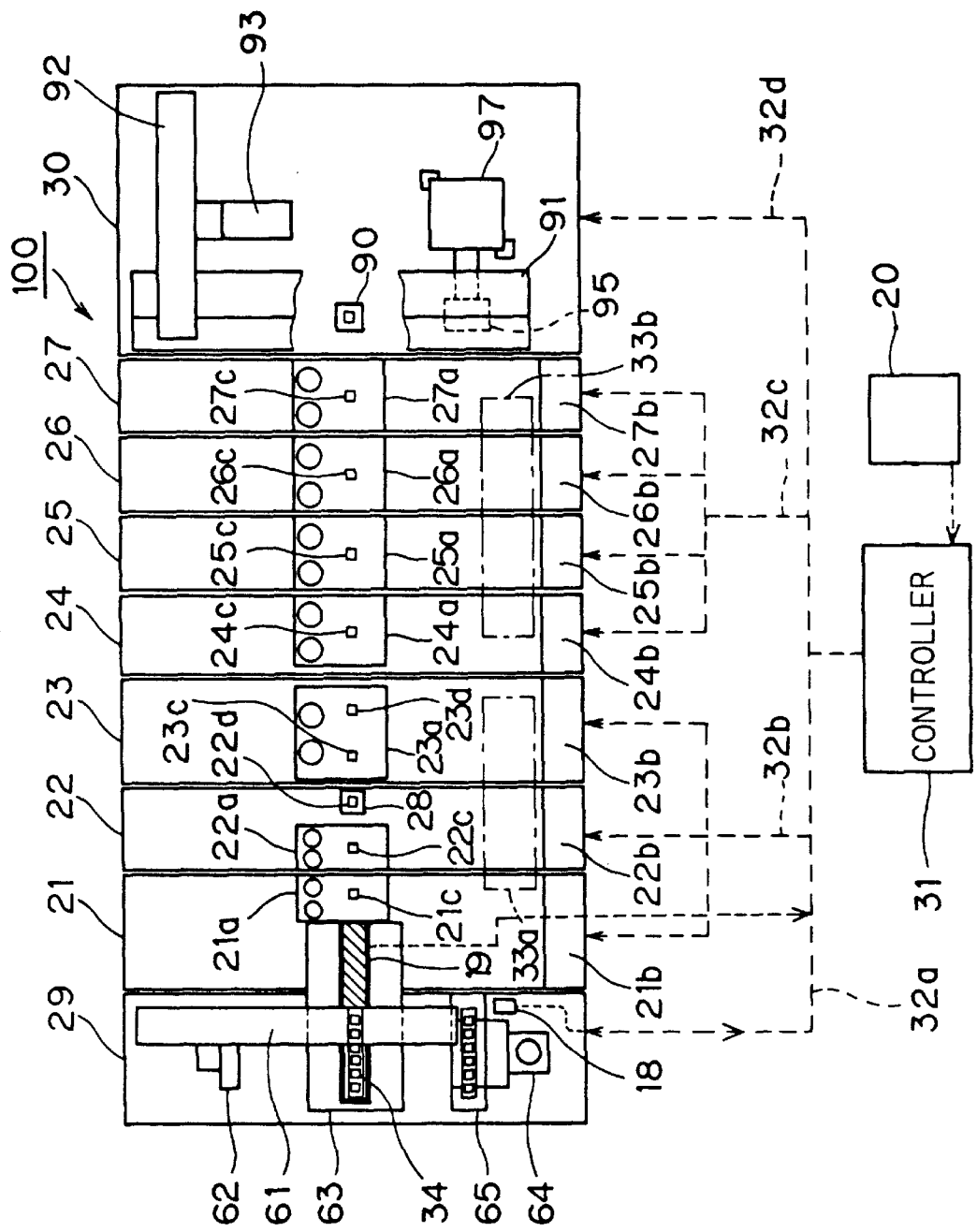
FIG. 1 is an overall plan view of an apparatus for fabricating semiconductor devices according to an embodiment of the present invention.

FIG. 1 is a general plan view showing a semiconductor fabricating apparatus, i.e., an apparatus 100 for fabricating semiconductor devices according to this embodiment. This semiconductor fabricating apparatus 100 fabricates semiconductor devices by executing molding (press working) of a lead frame which is resin-molded with semiconductor chips. The apparatus 100 comprises a loader 29 for supplying a lead frame 34 in which semiconductor devices are integrated, a series of press units 21 to 27 for successively working the lead frame 34, an unloader 30 for collecting and discharging completely worked semiconductor devices, a controller 31 for controlling the respective apparatus parts, and a computer 20 for supplying variety information to the controller 31.

The computer 20 and the controller 31 are connected with each other by a signal line. The respective press units 21 to 27 independently comprise control units 21b to 27b, which are connected with the controller 31 by control lines 32b and 32c. The loader 29 is provided with a card reader 18 and a frame thickness detection unit 19, which are connected with the controller 31 by a control line 32a. Further, the unloader 30 and the controller 31 are connected with each other by a control line 32d.

<A-2. Structure of Loader 29>

Figure 2:
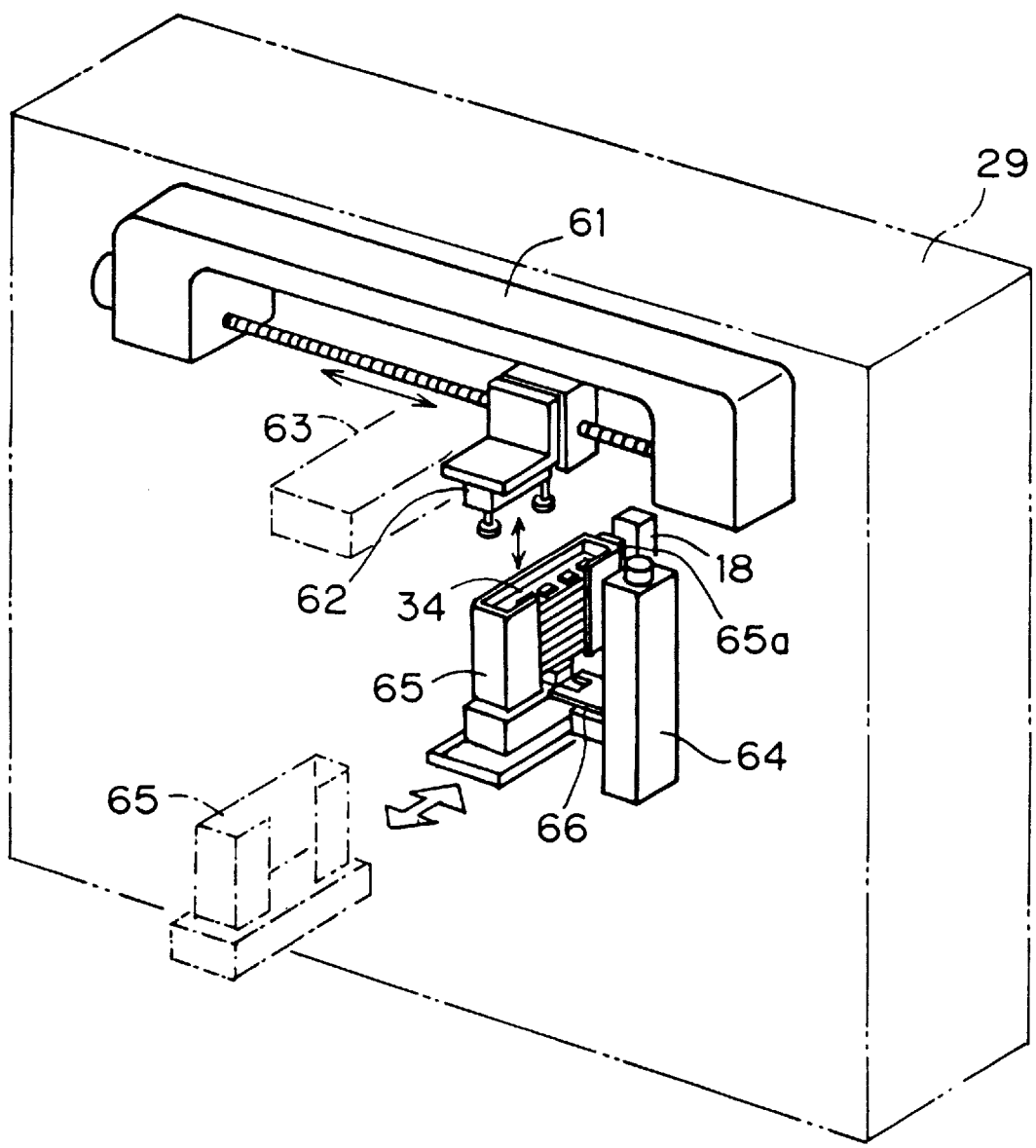
FIG. 2 is a perspective view showing a loader part of the apparatus shown in FIG. 1.
Figure 3:
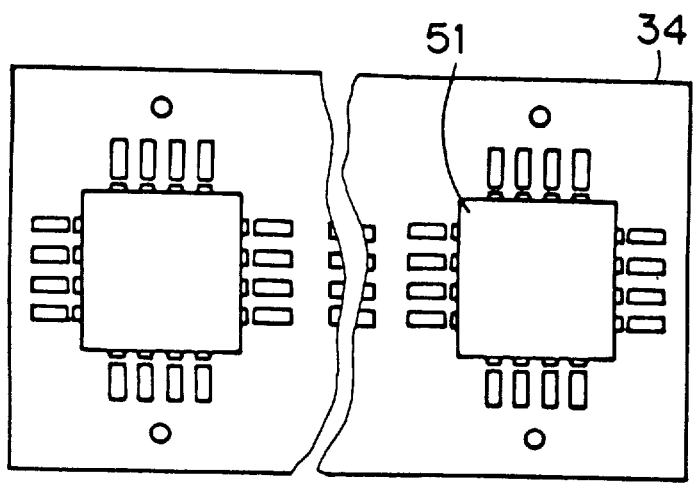
FIG. 3 is a plan view of a lead frame, which is a workpiece.

FIG. 2 is a perspective view showing the loader 29, and FIG. 3 is a plan view of the lead frame 34, which is the workpiece for the apparatus 100. Sealing resin members 51, each sealing a plurality of (e.g., four or eight) semiconductor devices, are aligned with each other on the lead frame 34. The sealing resin members 51 seal the semiconductor chips with parts of the lead frame 34. In other words, the lead frame 34 is formed by integrally connecting a plurality of elemental leads serving as materials for leads of single elemental semiconductor devices with each other.

The loader 29 is provided with a frame elevation unit 64, and a frame magazine 65 storing a number of lead frames 34 in a stacked manner is set to be opposed to the frame elevation unit 64. The frame elevation unit 64 is provided with a vertically movable elevation pawl 66. This elevation pawl 66 supports the lead frames 34 which are stored in the frame magazine 65 from bottom portions thereof by action of a motor (not shown) provided on the frame elevation unit 64.

The loader 29 is further provided with a cut press conveyor rail unit 63 horizontally in proximity to the frame magazine 65 which is set on a prescribed position. A direct acting unit 61 is set above the frame magazine 65 and the cut press conveyor rail unit 63 to extend over the same. This direct acting unit 61 comprises a ball screw, which is so rotated/driven by a motor (not shown) that a frame suction head 62 horizontally reciprocates across the frame magazine 65 and the cut press conveyor rail unit 63.

The frame suction head 62 is moved while sucking the uppermost one of the lead frames 34 which are stored in the frame magazine 65, thereby placing this lead frame 34 on a prescribed position of the cut press conveyor rail unit 63. The elevation pawl 66 is upwardly moved by the thickness of a single lead frame 34 every time the uppermost lead frame 34 is taken out from the frame magazine 65. Thus, the uppermost lead frame 34 is maintained at a constant height.

The loader 29 is further provided with the card reader 18. Further, an IC card 65a recording variety information of the stored lead frames 34 is attached to an outer side surface of the frame magazine 65. The card reader 18 reads the information recorded in the IC card 65a, and transmits the same to the controller 31.

<A-3. Structures of Press Units 21 to 23>

Figure 4:
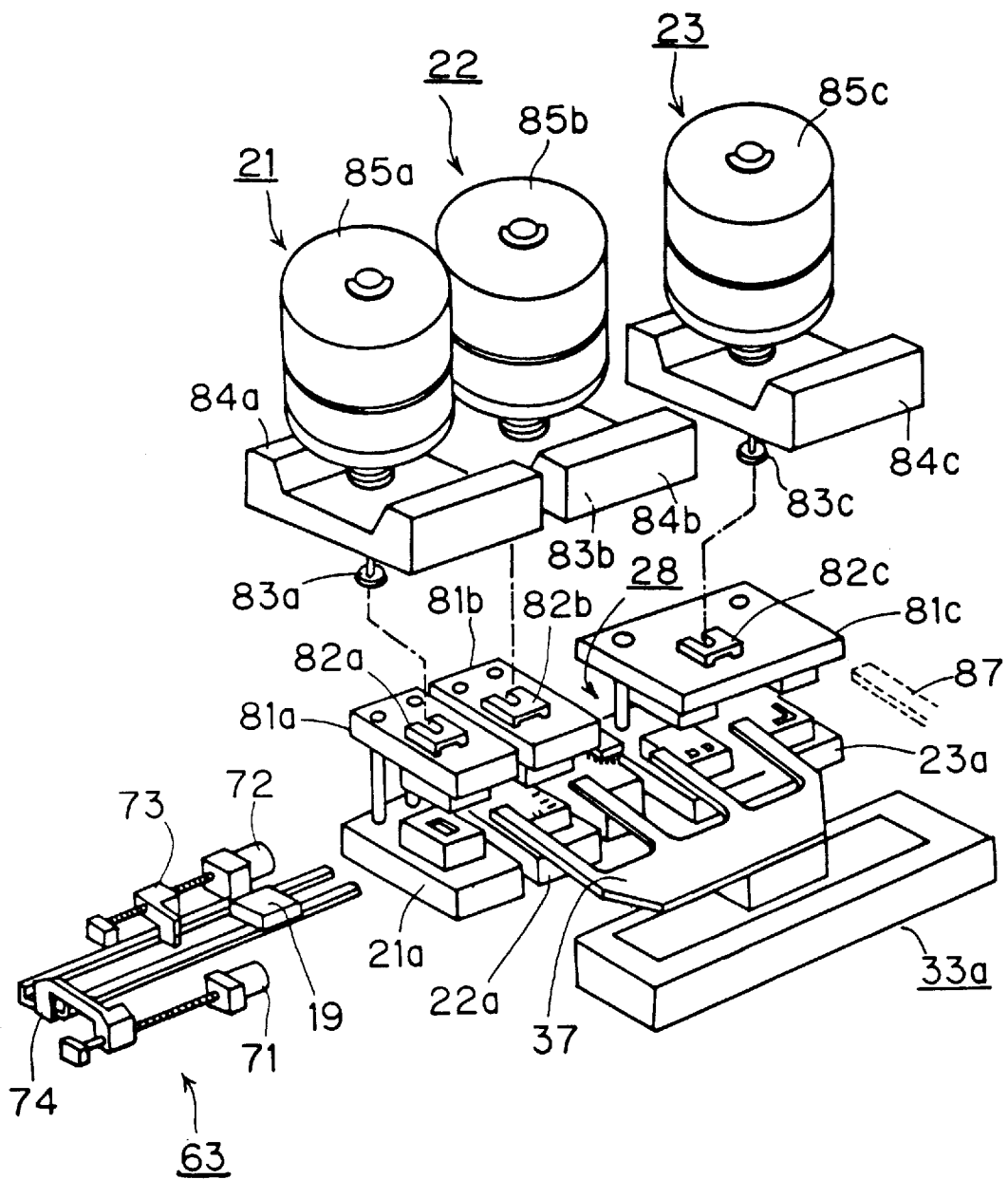
FIG. 4 is a perspective view showing a part of the apparatus of FIG. 1 carrying out cutting.

FIG. 4 is a perspective view showing the three press units 21 to 23 which are employed for cutting steps. FIG. 4 also shows the cut press conveyor rail unit 63 which is provided on the loader 29. The press units 21, 22 and 23 comprise lower mold holders 21a, 22a and 23a and upper mold holders 81a, 81b and 81c respectively. Lower and upper molds are mounted on upper surfaces of the lower mold holders 21a, 22a and 23a and lower surfaces of the upper mold holders 81a, 81b and 81c respectively. Further, shank holders 82a, 82b and 82c are fixedly set on the upper surfaces of the upper mold holders 81a, 81b and 81c respectively.

The press units 21, 22 and 23 further comprise press rams 84a, 84b and 84c, and press motors 85a, 85b and 85c for independently driving the respective ones thereof respectively. Shanks 83a, 83b and 83c which are projections are fixedly set on the lower surfaces of the press rams 84a, 84b and 84c, to be engaged with the shank holders 82a, 82b and 82c respectively thereby transmitting vertical movements of the press rams 84a, 84b and 84c to the upper mold holders 81a, 81b and 81c. The upper molds which are mounted on the upper mold holders 81a, 81b and 81c are pressed by the lower molds which are mounted on the lower mold holders 21a, 22a and 23a respectively, thereby cutting the lead frame 34.

The press unit 22 comprises a brush unit 28, so that a brush 76 provided thereon eliminates chips etc. resulting from the cutting from the workpiece. A suction mechanism (not shown) is provided under the brush unit 28 to suck the chips etc. eliminated from the workpiece by the brush 76 and eliminate the same to the exterior of the apparatus 100.

An internal conveyor unit 33a is set on a side of the lower mold holders 21a, 22a and 23a which are aligned with each other, across the press units 21 to 23. The internal conveyor unit 33a comprises an arm 37 which is slidable in parallel with the lower mold holders 21a, 22a and 23a. The arm 37 is in the form of comb teeth having a plurality of projections protruding from a base. This arm 37 sucks and holds the workpiece, thereby moving the same between the molds.

Figure 5:
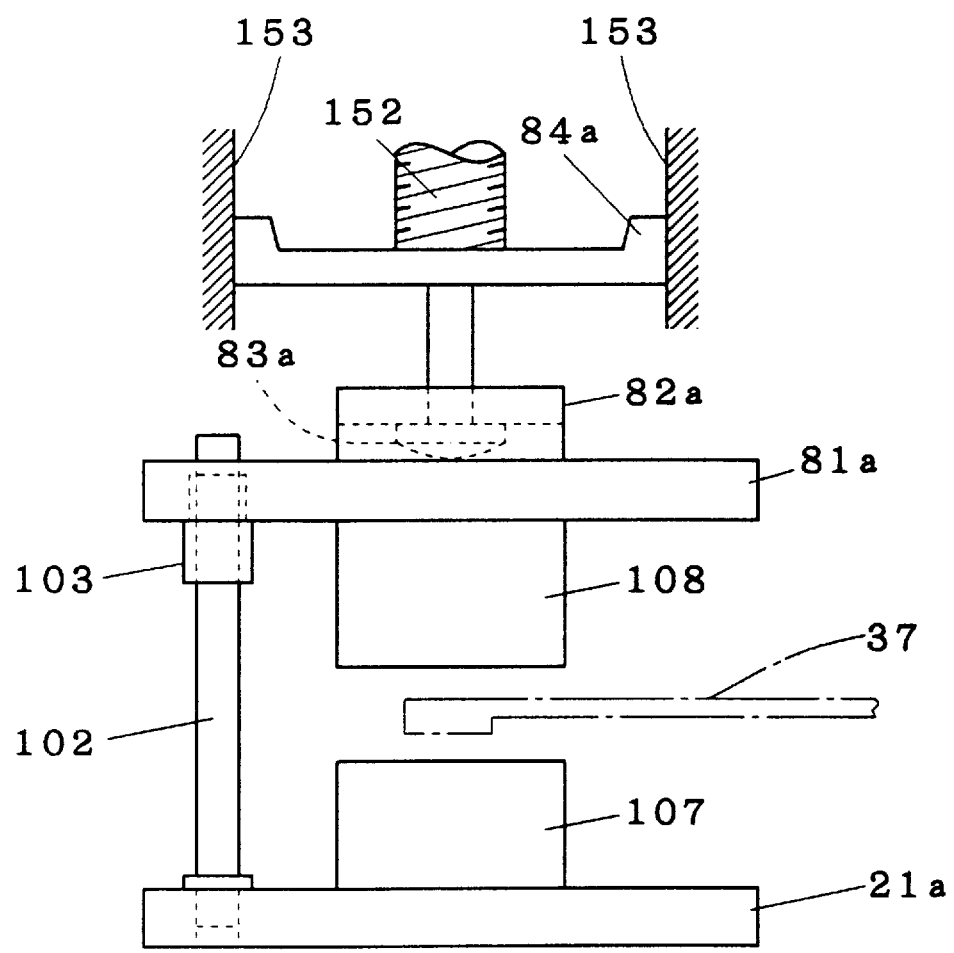
FIG. 5 is a side elevational view showing a die set of the apparatus shown in FIG. 1.
Figure 6:
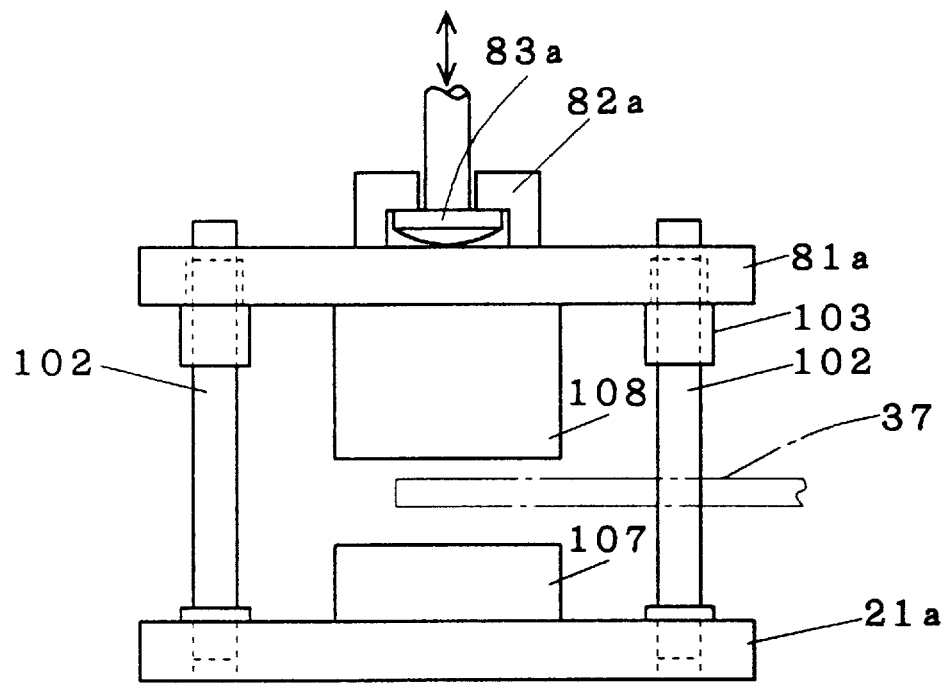
FIG. 6 is a front elevational view of the die set shown in FIG. 5.

FIGS. 5 and 6 are a side elevational view and a front elevational view showing a die set forming the principal part of the press unit 21 respectively. While FIGS. 5 and 6 typically show the press unit 21, the remaining press units 22 to 27 also have similar structures.

As shown in FIGS. 5 and 6, a lower mold 107 is mounted on the upper surface of the flat plate type lower mold holder 21a. Further, two vertically extending guide posts 102 are fixed to the lower mold holder 21a. These guide posts 102 support the upper mold holder 81a to be axially slidable along the vertical direction. Guide bushes 103 are fixedly mounted to sliding portions of the guide posts 102 for the upper mold holder 81a, in order to implement smooth sliding. On the other hand, an upper mold 108 is mounted on the lower surface of the upper mold holder 81a, while the shank holder 82a is fixedly mounted on its upper surface. The shank holder 82a is engaged with the shank 83a.

The shank 83a is a projection which consists of a shaft member downwardly projecting from the bottom surface of the press ram 84a in the form of a bar, and a flange member having a substantially semispherical top portion connected with its forward end. The press ram 84a fixedly mounted on a ball screw 152 which is vertically driven by the press motor 85a (FIG. 4) is vertically slidably supported by a ram guide 153 which is fixedly connected with the lower mold holder 21a. Namely, the press ram 84a is so guided by the ram guide 153 as to stably implement vertical movements of the ball screw 152 and the shank 83a.

Figure 7:
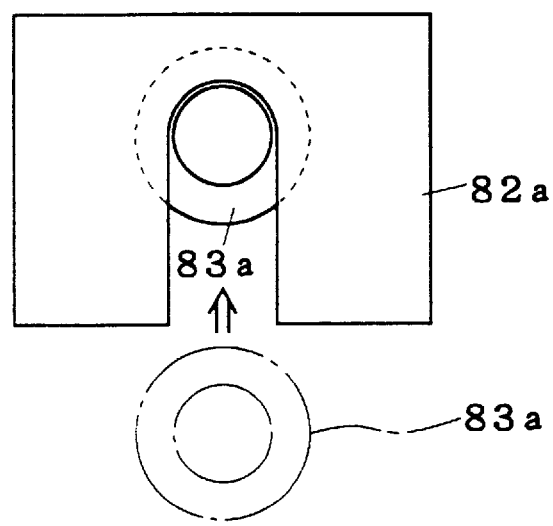
FIG. 7 is a plan view of a shank holder shown in FIG. 5.

FIG. 7 is a plan view showing the relation between the shank 83a and the shank holder 82a. As shown in FIG. 7, an elongated recess having a width which is slightly larger than the diameter of the shaft member of the shank 83a is formed in the upper surface of the shank holder 82a from an end toward the center. The shaft member of the shank 83a is so inserted in this recess that the flange member of the shank 83a is engaged with the peripheral edge of the recess of the shank holder 82a.

Thus, the shank 83a and the shank holder 82a are engageable/disengageable with/from each other. While it may be necessary to exchange the lower and upper molds 107 and 108 in response to the type of the semiconductor devices to be fabricated, such exchange is carried out every die set by disengaging the shank 83a and the shank holder 82a from each other. The flange member of the shank 83a is set in such a thickness that some play is formed in the vertical direction when the flange member is inserted in the shank holder 82a. Thus, smooth engagement/disengagement is regularly enabled regardless of dimensional tolerance in fabrication of the flange member and the shank holder 82a.

Vertically downwardly directed pressing force which is applied to the ball screw 152 by the press motor 85a is transferred to the shank 83a, and further transferred from the top portion of the shank 83a to the upper mold holder 81a. Consequently, the upper and lower molds 108 and 107 are closed through the lead frame 34 which is the workpiece.

In the die set shown in FIGS. 5 and 6, the two guide posts 102 are provided rearward beyond a prescribed portion on the lower mold 107 for receiving the lead frame 34 which is the workpiece, i.e., rearward beyond the pressing force center (coincident with the central axis of the ball screw 152) as viewed from the side provided with the internal conveyor unit 33a, and no member for supporting the upper mold holder 81a is provided in front thereof. Namely, no member interferes with the operation of the arm 37 which is inserted in the clearance between the upper and lower molds 108 and 107. Thus, it is possible to integrate the internal conveyor unit 33a into the apparatus 100.

Figure 8:
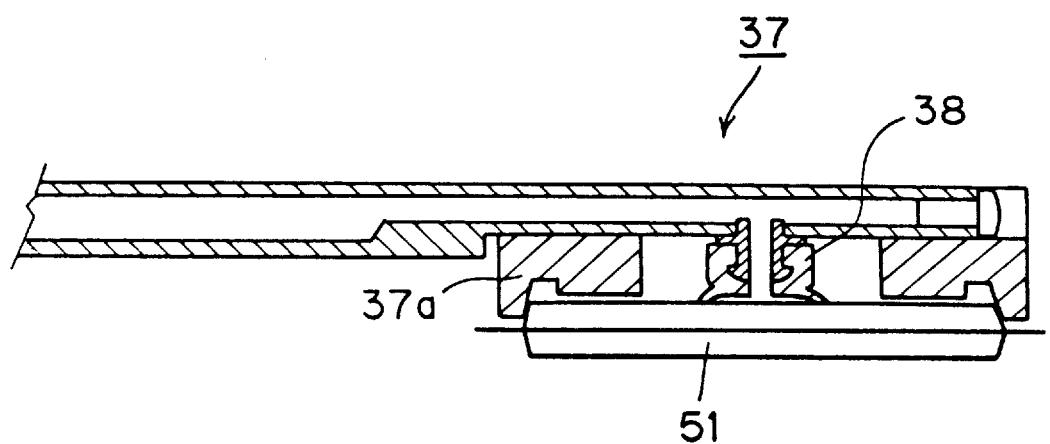
FIG. 8 is a sectional view showing an arm of an internal conveyor.

FIG. 8 is a sectional view showing the projection of the arm 37. As shown in FIG. 8, the projection has a hollow interior, which serves as a suction path. A suction pad 38 is mounted on the lower surface of the forward end of the projection, and a hole is provided in the central portion of the suction pad 38 to communicate with the suction path. Further, a guide 37a is mounted on the periphery of the suction pad 38.

The arm 37 is connected with a vacuum unit (not shown), which operates to decompress a vacuum path. Thus, it is possible to suck the upper surface of the sealing resin member 51 of the workpiece by the suction pad 38. Thus, the arm 37 supports the workpiece by sucking the upper surface of the sealing member 51 without being in contact with the lead frame 34, whereby the workpiece can be transferred with no damage or deformation the lead frame 34. Thus, it is possible to obtain products in high working accuracy in the apparatus 100.

Further, the guide 37a guides the sealing resin member 51 to a prescribed position, thereby enabling holding of the workpiece at the prescribed position. This enables smooth transfer of the workpiece by the arm 37. In other words, this contributes to improvement in efficiency of the operation.

As shown in FIG. 4, the cut press conveyor rail unit 63 comprises two conveyor pawls 74 and 73, which are driven by driving motors 71 and 72 to the direction for carrying the lead frame 34 respectively. The conveyor pawl 74 carries the lead frame 34 which is placed on the cut press conveyor rail unit 63 to a pitch feed start position by action of the frame suction head 62. The other conveyor pawl 73 carries the lead frame 34 which is carried to the pitch feed start position stepwise every distance corresponding to the product pitch.

The cut press conveyor rail unit 63 further comprises the frame thickness detection unit 19, which detects the thickness of the lead frame 34 as placed.

<A-4. Structures of Press Units 24 to 27>

Figure 9:
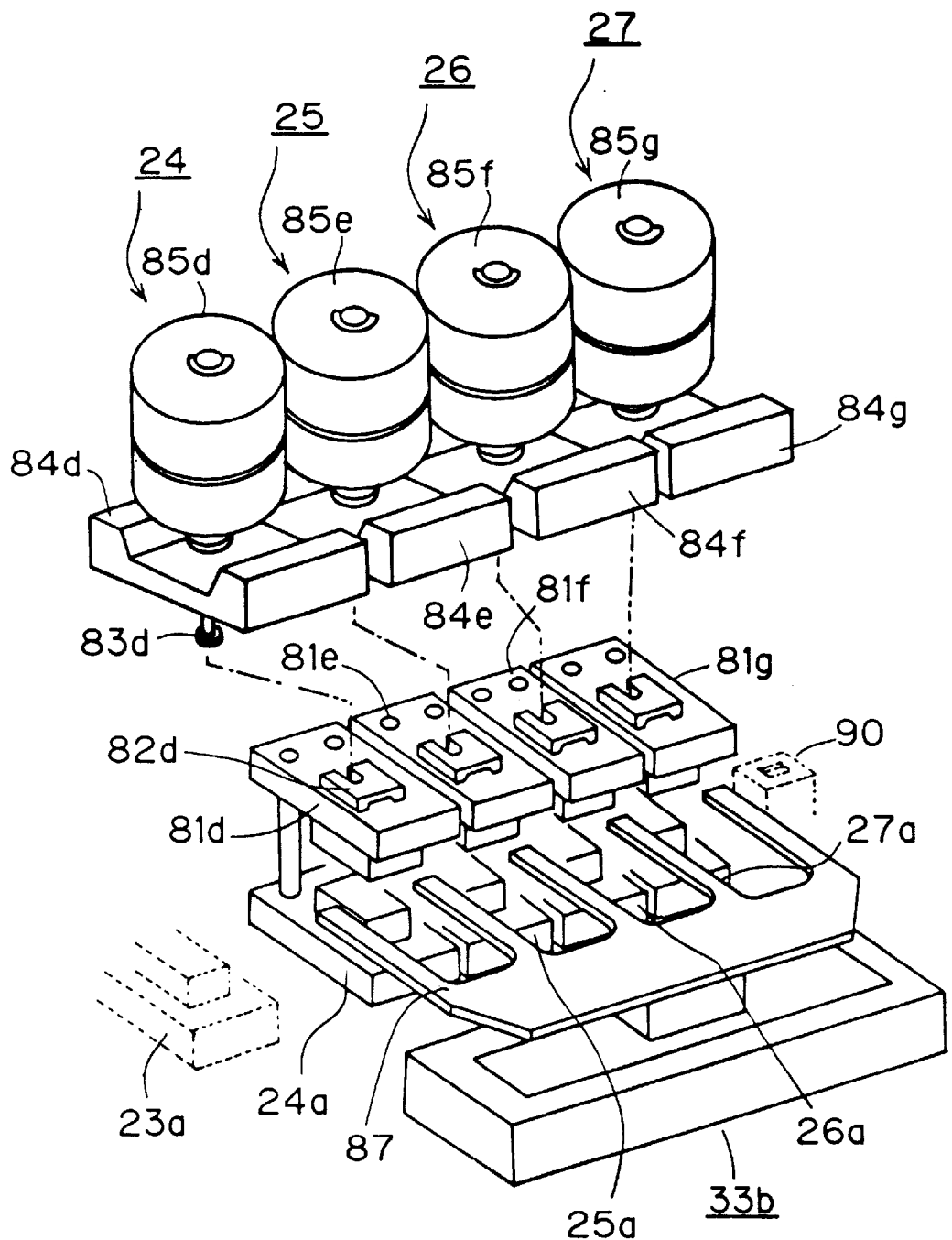
FIG. 9 is a perspective view showing a part of the apparatus shown in FIG. 1 carrying out bending.

FIG. 9 is a perspective view showing the four press units 24 to 27 which are employed for bending steps. The press units 24 to 27 are similar in structure to the press units 21 to 23. Namely, the press units 24, 25, 26 and 27 comprise lower mold holders 24a, 25a, 26a and 27a and upper mold holders 81d, 81e, 81f and 81g respectively. Lower molds are mounted on the upper surfaces of the lower mold holders 24a, 25a, 26a and 27a, and upper molds are mounted on the lower surfaces of the upper mold holders 81d, 81e, 81f and 81g respectively. Further, shank holders 82d, 82e, 82f and 82g are fixedly set on the upper surfaces of the upper mold holders 81d, 81e, 81f and 81g respectively.

The press units 24, 25, 26 and 27 further comprise press rams 84d, 84e, 84f and 84g and press motors 85d, 85e, 85f and 85g for independently driving the same respectively. Shanks 83d, 83e, 83f and 83g which are projections are fixedly set on the lower surfaces of the press rams 84d, 84e, 84f and 84g respectively, to be engaged with the shank holders 82d, 82e, 82f and 82g respectively, thereby transmitting vertical movements of the press rams 84d, 84e, 84f and 84g to the upper mold holders 81d, 81e, 81f and 81g. The upper molds which are mounted on the upper mold holders 81d, 81e, 81f and 81g are pressed against the lower molds which are mounted on the lower molds 24a, 25a, 26a and 27a respectively, thereby carrying out the steps of bending the lead frame 34.

An internal conveyor unit 33b is set on a side of the lower mold holders 24a, 25a, 26a and 27a which are aligned with each other across the press units 24 to 27. The internal conveyor unit 33b comprises an arm 87 which is slidable in parallel with the lower mold holders 24a, 25a, 26a and 27a. The arm 87 is in the form of comb teeth having a plurality of projections protruding from a base. This arm 87 sucks and holds the workpiece, thereby moving the same between the molds. The sectional structure of each projection provided on the arm 87 is identical to that of each projection of the arm 37 shown in FIG. 8.

<A-5. Structure of Unloader 30>

Figure 10:
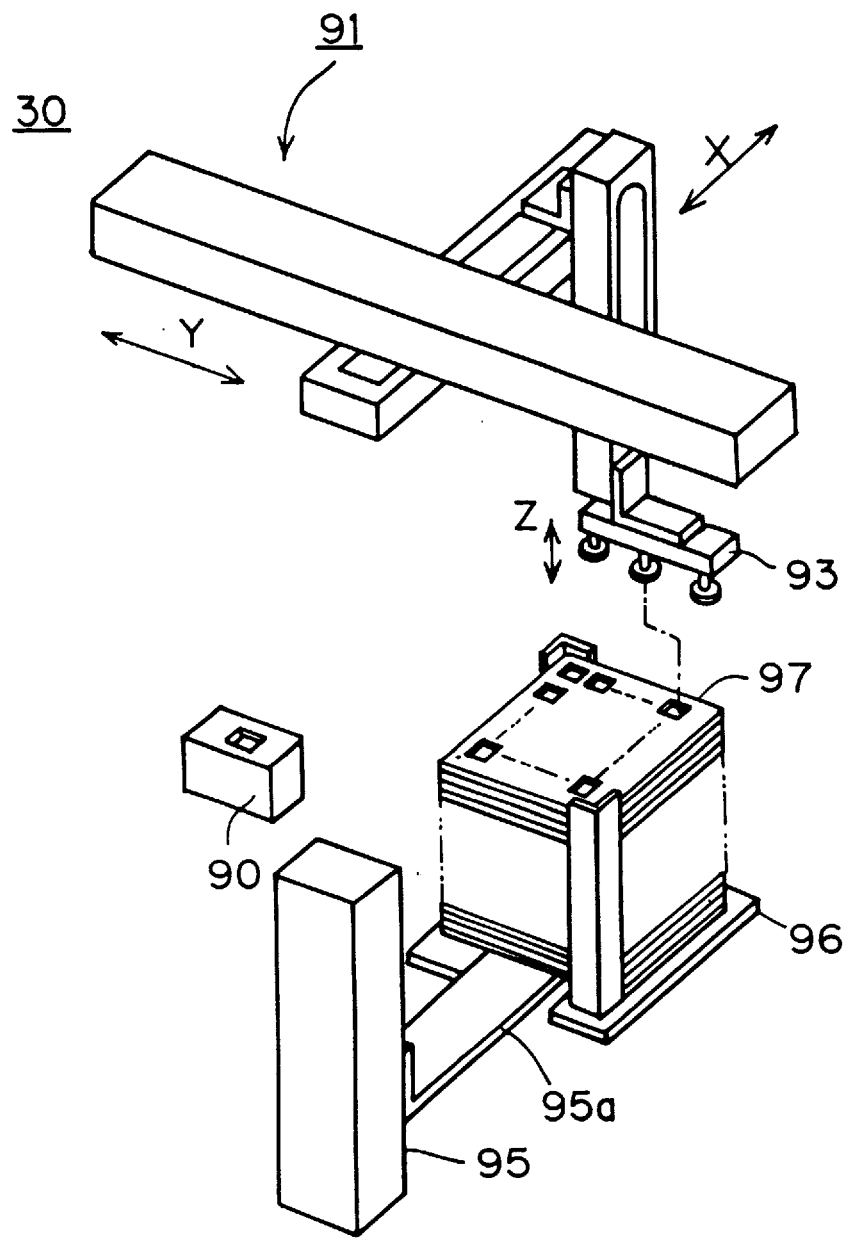
FIG. 10 is a perspective view showing an unloader part of the apparatus shown in FIG. 1.

FIG. 10 is a perspective view showing the unloader 30. As shown in FIG. 10, the unloader 30 is provided with a pallet elevation unit 95, and a product storage pallet stocker 96 is set to be opposed to the pallet elevation unit 95. Vacant product storage pallets 97 are introduced into the product storage pallet stocker 96 from above, so that a number of semiconductor devices are stored in the vacant product storage pallets 97 as products.

The pallet elevation unit 95 comprises a vertically movable elevation pawl 95a. This elevation pawl 95a supports the product storage pallets 97 which are carried on the product storage pallet stocker 96 from bottom portions thereof by action of a motor (not shown) provided on the pallet elevation unit 95, while being downwardly moved by the thickness of a single product storage pallet 97 every time the vacant product storage pallet 97 is newly introduced. Thus, the uppermost product storage pallet 97 is maintained at a constant height.

The unloader 30 is further provided with a product receiving stage 90 horizontally in proximity to the product storage pallet stocker 96 which is set on a prescribed position. The semiconductor devices serving as products finally completely bent by the press unit 27 are placed on the product receiving stage 90 due to action of the arm 87. An orthogonal robot 91 is set above the product storage pallet stocker 96 and the product receiving stage 90.

The orthogonal robot 91 comprises a suction head 93 which is movable in three directions including two horizontal directions (directions X and Y in FIG. 10) and the vertical direction (direction Z in FIG. 10). The suction head 93 sucks and moves the semiconductor devices serving as products which are placed on the product receiving stage 90, to place the same on prescribed positions in the uppermost product storage pallet 97 placed on the product storage pallet stocker 96. The suction head 93 is also adapted to supply the vacant product storage pallet 97 into the product storage pallet stocker 96 from above.

As hereinabove described, the apparatus 100 sequentially works the lead frames 34 which are stored in the frame magazine 65 to fabricate the semiconductor devices serving as products, and stores the same in the product storage pallets 97 which are placed on the prescribed positions.

As shown in FIG. 1, the cut press conveyor rail unit 63, the lower molds which are mounted on the lower mold holders 21a to 27a, the brush unit 28, and the product receiving stage 90 are aligned with each other to define a straight path for the workpieces between the cut press conveyor rail unit 63 and the product receiving stage 90. Thus, smooth movements of the workpieces are enabled and the structures of the internal conveyor units 33a and 33b are simplified.

The control units 21b to 27b independently drive the press motors 85a to 85g which are provided on the respective press units 21 to 27 on the basis of instructions from the controller 31.

<A-6. Operation of Apparatus 100 (Cutting)>

Figure 11:
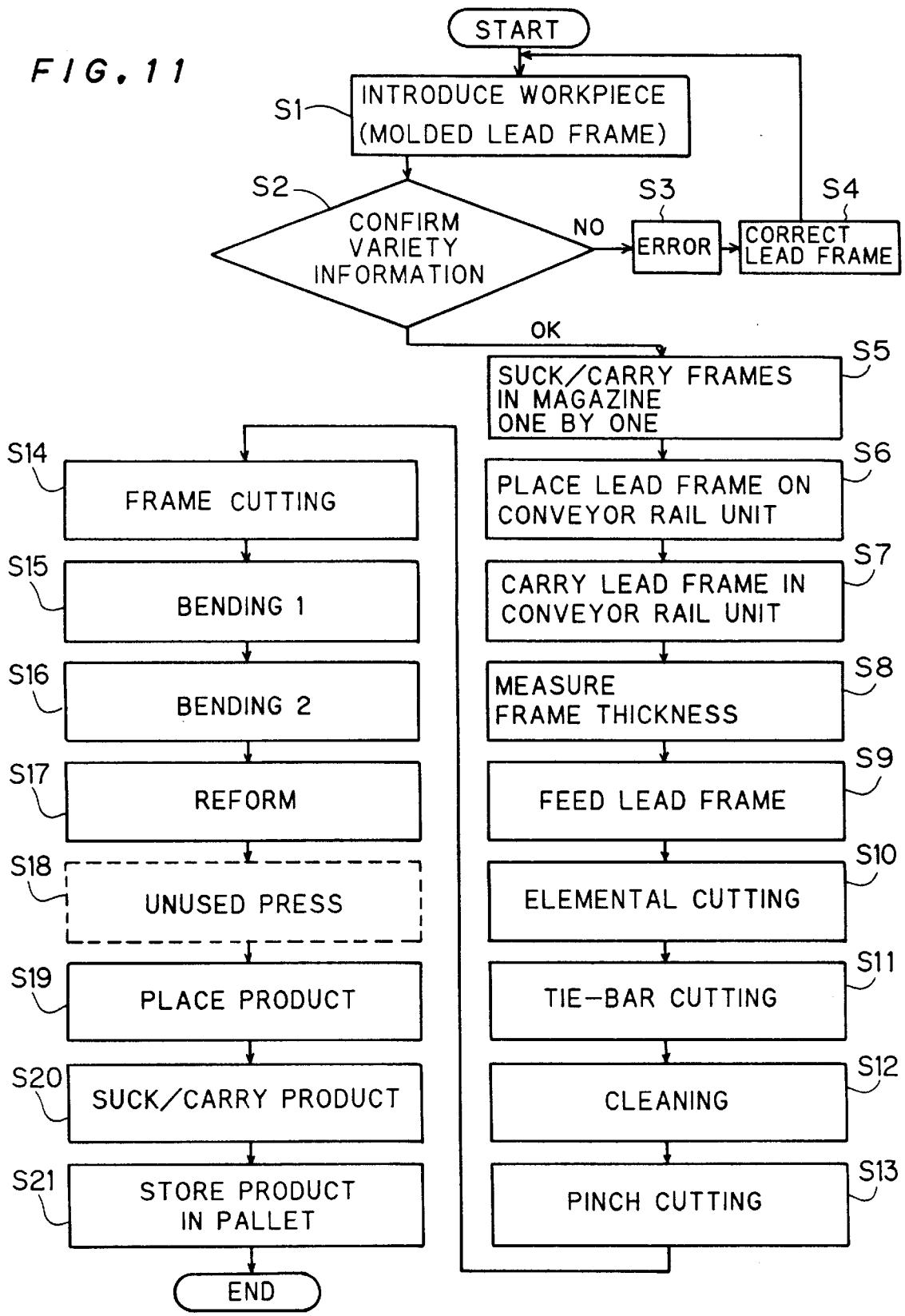
FIG. 11 is a flow chart showing the flow of an operation employing the apparatus shown in FIG. 1.

FIG. 11 is a flow chart showing the flow of the operation of fabricating semiconductor devices through the apparatus 100. In advance of this operation, variety information of the workpieces, i.e., information related to the type, the shape, the material, the type of plating etc. is previously supplied to the computer 20 (FIG. 1). The controller 31 controls the operations of the press units 21 to 27, the loader 29 and the unloader 30 on the basis of the variety information provided in the computer 20. The variety information is provided to a storage medium such as a RAM, for example, in the form of electric signals.

When the operation shown in FIG. 11 is started, the lead frames 34 (FIG. 3) which are the workpieces are first introduced at a step S1. Namely, the frame magazine 65 receiving the lead frames 34 is set on the prescribed position of the loader 29.

Then, the variety information is confirmed at a step S2. Namely, the information recorded in the IC card 65a which is attached to the frame magazine 65 is read by the card reader 18, while the same is compared with the information related to the variety fed from the computer 20. When the varieties are coincident with each other, i.e., when the lead frames 34 which are placed on the frame magazine 65 set on the loader 29 are not erroneous, the process advances to a step S5.

If an error is recognized, on the other hand, the process advances to a step S3, to display the error. The error can be displayed by providing a display unit on the card reader 18 or the controller 31, for example. When the error is displayed on the display unit, the process advances to a step S4, so that correct lead frames 34 are prepared and placed on the frame magazine 65. Thereafter the process returns to the step S1, so that the newly prepared frame magazine 65 is set on the prescribed position of the loader 29.

At the step S5, the frame suction head 62 sucks and moves the uppermost lead frame 34 which is placed on the frame magazine 65.

At a step S6, the frame suction head 62 places the lead frame 34 on the prescribed position of the cut press conveyor rail unit 63.

At a step S7, the lead frame 34 is carried to the pitch feed start position by the conveyor pawl 74 (FIG. 4).

At a step S8, the frame thickness detection unit 19 detects the thickness of the lead frame 34. The value of the detected thickness is transmitted to the controller 31. The controller 31 sets operation conditions such as press load conditions and the molding step number, i.e., the type of the press unit to be employed, in the press units 21 to 27 on the basis of the variety information transmitted from the computer 20 and the value of the thickness received from the frame thickness detection unit 19.

Then, the process advances to a step S9, so that the conveyor pawl 73 provided on the cut press conveyor rail unit 63 operates to feed the lead frame 34 by the product pitch. Thus, a lead frame portion corresponding to a single semiconductor device is placed on a prescribed position (portion) of the lower mold which is mounted on the lower mold holder 21a provided on the press unit 21 for executing press working of the first stage.

Figure 12:
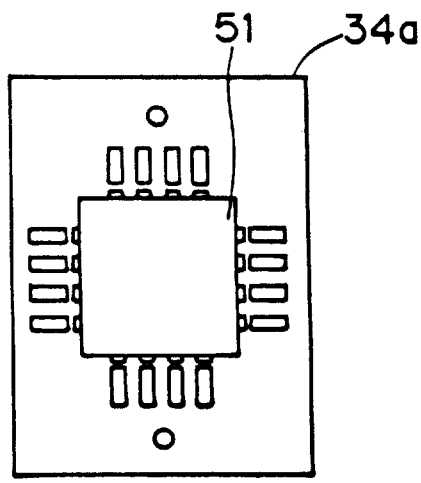
FIG. 12 is a plan view showing a shape change following working of the lead frame.

Thereafter the process advances to a step S10 so that the press unit 21 operates on the basis of an instruction by the controller 31, thereby executing the press working of the lead frame portion which is placed on the lower mold provided on the lower mold holder 21a. The press unit 21 carries out elemental cutting. Namely, the lead frame portion (one of a plurality of elemental leads which are connected with each other) corresponding to the single semiconductor device is separated from the remaining portions. FIG. 12 is a plan view showing the semiconductor device obtained upon the elemental cutting. The lead frame portion is separated from the remaining portions to define a lead frame 34a.

Figure 13:
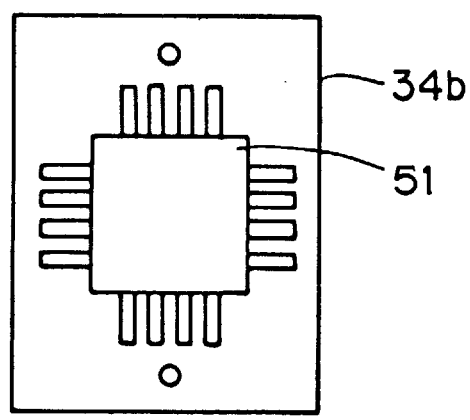
FIG. 13 is a plan view showing a shape change following working of the lead frame.

At a step S11, the internal conveyor unit 33a first operates so that the semiconductor device which is placed on the lower mold provided on the lower mold holder 21a is transferred to a prescribed position (portion) of the lower mold provided on the lower mold holder 22a of the next stage press unit 22. Thereafter the press unit 22 operates to execute new press working of tie-bar cutting. Namely, tie-bars provided on the lead frame 34a are cut. FIG. 13 is a plan view showing the semiconductor device obtained upon the tie-bar cutting. The lead frame 34a, from which the tie-bars are cut off, defines a lead frame 34b.

At a step S12, the internal conveyor unit 33a operates again to transfer the semiconductor device from the lower mold provided on the lower mold holder 22a to a prescribed position (portion) of the brush unit 28. Thereafter the brush 76 operates to brush the semiconductor device, thereby eliminating flashes remaining on the lead frame 34b and chips of the sealing resin member 51 resulting from the cutting. At the same time, the flashes and the chips as eliminated are sucked by a suction mechanism (not shown) which is provided on the brush unit 28, and discharged to the exterior of the apparatus 100.

Figure 14:
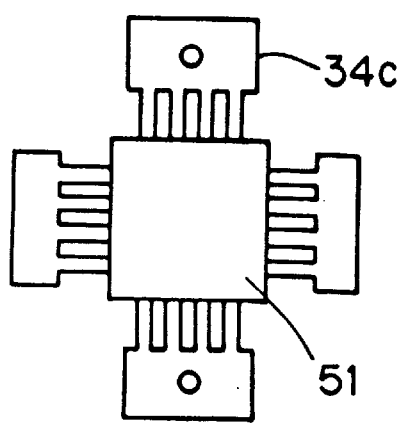
FIG. 14 is a plan view showing a shape change following working of the lead frame.

At a step S13, the internal conveyor unit 33a operates again to transfer the semiconductor device from the brush unit 28 to a prescribed position (portion) of the first lower mold which is provided on the lower mold holder 23a of the press unit 23. Thereafter the press unit 23 operates to execute pinch cutting of the semiconductor device. Namely, pinch portions are cut from the lead frame 34b. FIG. 14 is a plan view showing the semiconductor device obtained upon the pinch cutting. The lead frame 34b, from which the pinch portions are cut off, defines a lead frame 34c.

Figure 15:
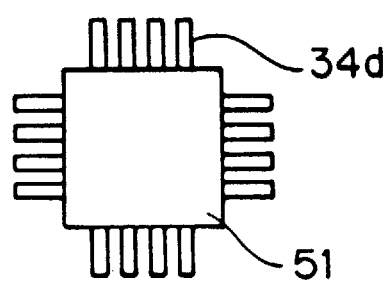
FIG. 15 is a plan view showing a shape change following working of the lead frame.

At a step S14, the internal conveyor unit 33a operates again to transfer the semiconductor device from the prescribed position (portion) of the first lower mold provided on the lower mold holder 23a to a prescribed position (portion) of the second lower mold which is provided on the same lower mold holder 23a. Thereafter the press unit 23 operates again, to execute frame cutting on the semiconductor device. Namely, unnecessary frame portions are cut from the lead frame 34c. FIG. 15 is a plan view showing the semiconductor device obtained upon the pinch cutting. The lead frame 34c, from which the frame portions are cut off, defines a lead 34d.

<A-7. Operation of Apparatus 100 (Carriage Operation in Cutting Step)>

Figure 16:
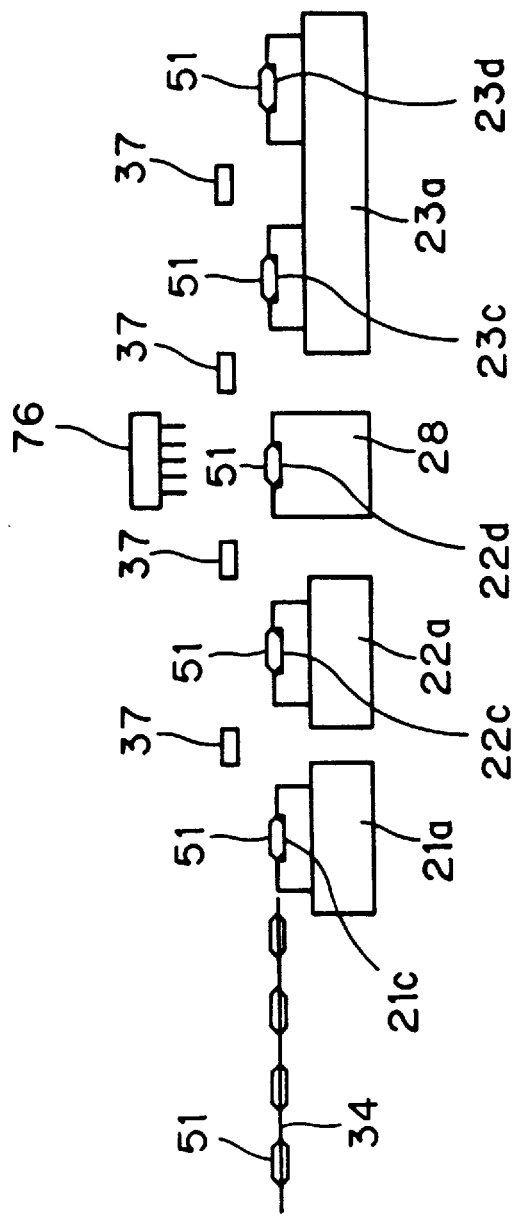
FIG. 16 is a an operation explanatory diagram showing the operation of the internal conveyor.
Figure 17:
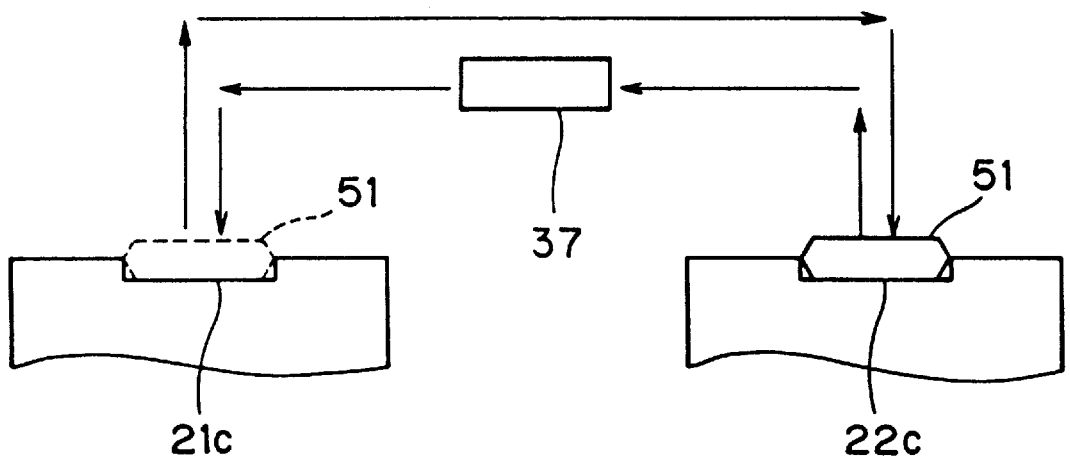
FIG. 17 is a an operation explanatory diagram showing the operation of the internal conveyor.

FIGS. 16 and 17 are operation explanatory diagrams for illustrating the semiconductor device transfer (internal carriage) step by the internal conveyor unit 33a. As shown in FIG. 16, grooves 21c, 22c, 23c, 23d and 22d are formed in the upper surfaces of the lower molds which are provided on the lower mold holders 21a, 22a and 23a and the upper surface of the brush unit 28 respectively, for positioning and supporting the semiconductor devices serving as workpieces one by one.

These grooves 21c, 22c, 22d, 23c and 23d are aligned with each other in this order, at regular intervals. Semiconductor devices (FIGS. 16 and 17 show portions of the sealing resin members 51 of the semiconductor devices) received in these grooves 21c, 22c, 22d, 23c and 23d are simultaneously transferred to next stage grooves by action of the arm 37 which is provided on the internal conveyor unit 33a. Therefore, the plurality of projections provided on the arm 37 are set at spaces corresponding to those between the grooves 21c, 22c, 22d, 23c and 2d.

The upper mold holders 81a, 81b and 81c are simultaneously moved downwardly and upwardly. While press working is executed, i.e., while the upper mold holders 81a, 81b and 81c are downwardly moved, the arm 37 is stopped in a standby position, i.e., an intermediate position (position of the arm 37 shown in FIGS. 16 and 17) in relation to the grooves 21c, 22c, 22d, 23c and 23d.

In a period between completion of certain press working and starting of next press working, i.e., while the upper and lower molds are separated from each other, the arm 37 is horizontally and vertically moved to suck and transfer the semiconductor device from the front stage groove (the groove 21, for example) to the next stage groove (the groove 22c, for example), as illustrated in FIG. 17.

In synchronization with removal of the semiconductor device from the groove 21c of the frontmost stage press unit 21 due to the action of the arm 37, the lead frame 34 which is placed on the cut press conveyor rail unit 63 is extruded by the conveyor pawl 73 by a product pitch, whereby a portion of the lead frame 34 corresponding to a new semiconductor device is placed on the groove 21c.

As hereinabove described, semiconductor devices which are workpieces are regularly placed on the grooves 21c, 22c, 22d, 23c and 23d except the transfer periods, so that the cutting work and stepwise transfer from an upstream portion toward a downstream portion are alternately repeated. The semiconductor devices are successively subjected to new cutting work every time the same are transferred from the upstream portion toward the downstream portion.

Further, the press units 21 to 23 simultaneously perform the press working and the semiconductor devices which are placed on the grooves 21c, 22c, 22d, 23c and 23d are also simultaneously transferred, whereby working efficiency is advantageously improved. In addition, the grooves 21c, 22c, 22d, 23c and 23d are aligned with each other at regular intervals, whereby the plurality of semiconductor devices which are placed on the grooves 21c, 22c, 22d, 23c and 23d can be simultaneously transferred by identical movements of the plurality of projections provided on the arm 37. Namely, the apparatus 100 can advantageously simplify the structure and the operation of the internal conveyor unit 33a, while enabling efficient transfer.

<A-8. Operation of Apparatus 100 (Bending)>

Figure 18:
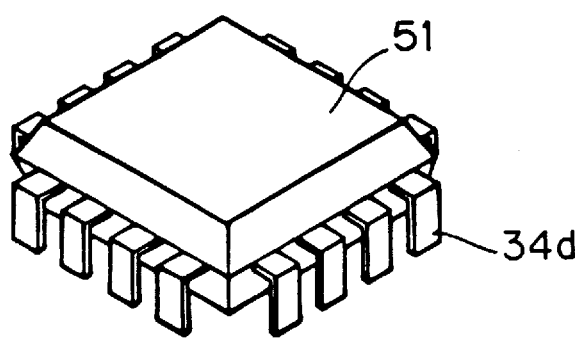
FIG. 18 is a plan view showing a shape change following working of the lead frame.

Referring again to the flow chart of FIG. 11, the process advances to a step S15 upon completion of the processing at the step S14. At the step S15, the other internal conveyor unit 33b operates to transfer the semiconductor device from the prescribed position of the second lower mold which is provided on the lower mold holder 23a of the press unit 23, i.e., the groove 23d, to a prescribed position (portion) of the lower mold provided on the lower mold holder 24a of the press unit 24. Thereafter the press unit 24 operates to bend shoulder portions of the lead 34d of the semiconductor device. FIG. 18 is a perspective view showing the semiconductor device obtained upon the bending of the shoulder portions of the lead 34d. The forward end portions of the lead 34d project downwardly as the result of bending of the shoulder portions.

At a step S16, the internal conveyor unit 33b operates again to transfer the semiconductor device from the lower mold provided on the lower mold holder 24a to a prescribed position (portion) of the lower mold provided on the lower mold holder 25a of the press unit 25. Thereafter the press unit 25 operates to bend foot portions of the lead 34d of the semiconductor device. FIG. 19 is a perspective view showing the semiconductor device which is obtained upon the bending of the foot portions of the lead 34d. The forward end portions of the lead 34d again horizontally project as the result of the bending of the foot portions.

Then, the internal conveyor unit 33b operates again at a step S17, whereby the semiconductor device is transferred from the lower mold provided on the lower mold holder 25a to a prescribed position (portion) of the lower mold provided on the lower mold holder 26a of the press unit 26. Thereafter the press unit 26 operates to bend the lead 34d. In this bending by the press unit 26, the shape of the lead 34d is precisely corrected. Consequently, a semiconductor device 35 serving as a product is completed as shown in a perspective view of FIG. 20.

At a step S18, the internal conveyor unit 33b operates again to transfer the semiconductor device from the lower mold provided on the lower mold holder 26a to a prescribed position (portion) of the lower mold provided on the lower mold holder 27a of the press unit 27. As to the semiconductor device herein illustrated, the press unit 27, for example, is unnecessary and stopped. Thus, the semiconductor device 35 serving as a product is only temporarily placed on the lower mold provided on the lower mold holder 27a of the press unit 27 and subjected to no processing, and the process advances to a next step S19.

At the step S19, the internal conveyor unit 33b operates again to transfer the semiconductor device from the lower mold provided on the lower mold holder 27a to the product receiving stage 90 provided on the unloader 30.

At a step S20, the semiconductor device 35 placed on the product receiving stage 90 is sucked by the suction head 93 which is provided on the orthogonal robot 91 and carried to a prescribed position of the product storage pallet 97. Thereafter the sucked semiconductor device 35 is relieved in the prescribed position of the product receiving pallet 97 at a step S21, to be stored in the product storage pallet 97.

The aforementioned steps are repeated, to fabricate semiconductor devices 35 serving as products.

<A-9. Operation of Apparatus 100 (Carriage Operation in Bending Step)>

The lower molds provided on the lower mold holders 24a, 25a, 26a and 27a of the press units 24 to 27 are also provided with grooves (not shown) for receiving semiconductor devices, similarly to the lower molds provided on the lower mold holders 21a, 22a and 23a of the press units 21 to 23. The groove 23c which is formed in the lower mold provided on the lower mold holder 23a of the press unit 23 executing the final cutting work, the grooves formed in the lower molds provided on the lower mold holders 24a, 25a, 26a and 27a of the press units 24 to 27 executing bending work and the product receiving stage 90 are aligned with each other at regular intervals. The spaces therebetween may not necessarily coincide with those between the grooves 21c, 22c, 22d, 23c and 23d.

The plurality of projections provided on the arm 87 of the internal conveyor unit 33b (FIG. 9) which is employed for transferring the semiconductor devices in the bending steps are set at spaces coincident with those between the grooves formed in the lower molds provided on the lower mold holders 24a, 25a, 26a and 27a. The projections of the arm 87 are identical in structure to those of the arm 37 shown in FIG. 8.

The press units 24 to 27 operate in synchronization with the press units 21 to 23. The internal conveyor unit 33b also operates in synchronization with the internal conveyor unit 33a. Namely, the internal conveyor units 33a and 33b operate in cooperation, thereby simultaneously successively feeding the semiconductor devices between the groove 21c which is formed in the lower mold provided on the lower mold holder 21a of the press unit 21 and the product receiving stage 90.

<A-10. Advantages of Apparatus 100>

As hereinabove described, the lead frame 34 is cut into the respective semiconductor devices (respective elemental leads) in the first stage of the press working for the lead frame 34, i.e., the working by the frontmost stage press unit 21. Thus, the press units 22 to 27 executing the press working following the second stage can work the semiconductor devices which are separated from each other. Therefore, it is not necessary to coincide the spaces between the molds (including the brush unit 28) in the press units 21 to 27 with the product pitches in the lead frame 34.

Consequently, the spaces between the press units 21 to 27 can be widely set, whereby the press motors 85a to 85g requiring high outputs can be independently set for the respective press units 21 to 27. This enables execution of press working every step. Further, the problem of the offset loads caused in the conventional apparatus 200 is also solved.

In addition, the torques of the press motors 85a to 85g are immediately converted to vertical linear motions by conversion mechanisms formed by ball screws which are directly connected with the rotary shafts of the press motors 85a to 85g and screws fitted with the ball screws, for example, with no employment of a complicated transmission mechanism such as a crank mechanism provided in the conventional apparatus. This also contributes to implementation of precise press working.

Even if the product pitches in the lead frame 34 are changed by a change of the type of the semiconductor devices to be fabricated or the like, it is not necessary to change the spaces between the molds in the press units 21 to 27 in response thereto. Further, the respective molds are generally in multiple structures, and it is not necessary to exchange at least external portions of the respective molds in response to the type of the semiconductor devices to be fabricated in general. If it is necessary to exchange the dies, the die set which is integrated with the molds itself can be exchanged by disengaging the shank 83a and the shank holder 82a from each other. Namely, various types of semiconductor devices can be fabricated with small labor at a small cost, by employing the apparatus 100.

Further, the computer 20 is previously provided with the variety information for the semiconductor devices to be worked, so that the press units 21 to 27 operate under proper conditions corresponding to the type of the semiconductor devices. Thus, precise press working is regularly implemented regardless of the type of the semiconductor devices.

In addition, the apparatus 100 is provided with the frame thickness detection unit 19, for optimumly setting press work operation conditions, such as values of press loads, for example, in consideration of the thickness of the lead frame 34 in addition to the variety information previously provided to the computer 20. Namely, precise press working is implemented also in consideration of dispersion (deviation) in thickness of the lead frame 34.

The dispersion in thickness of the lead frame 34 particularly derives from dispersion in thickness of solder plating applied to the surface of a base material such as that of copper, in addition to dispersion in thickness of the base material itself. The apparatus 100 also absorbs this dispersion in thickness, to regularly implement optimum press working.

<B. Second Embodiment: Variation in Arrangement of Apparatus>

It may be necessary to increase/decrease the number of the press units 21 to 27 as employed in response to the type of the semiconductor devices to be fabricated, while the apparatus 100, comprising the control units 21b to 27b for the respective press units 21 to 27 independently of each other, may not be regularly provided with a control unit which is responsive to the maximum number of press units. Namely, it is possible to freely change the arrangement of the press units in response to the type of the semiconductor devices at a low cost. Namely, various types of semiconductor devices can be fabricated with small labor at a small cost also in this point. Some examples different from FIG. 1 are now illustrated in relation to arrangement of a plurality of press units.

Figure 21:
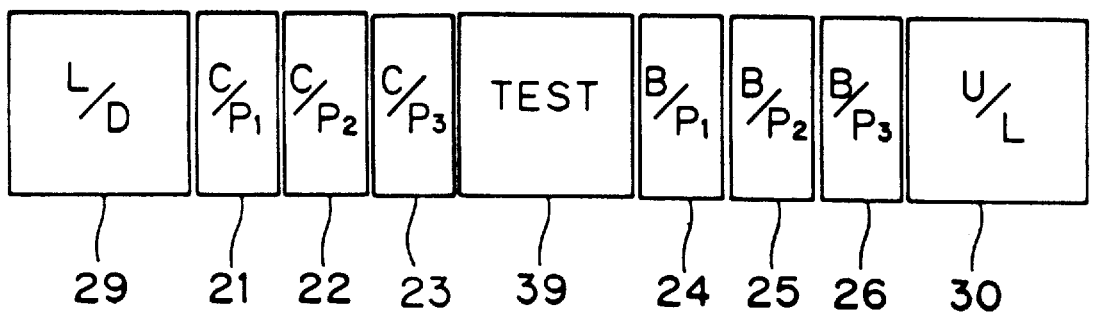
FIG. 21 is a block diagram showing a variation of the arrangement of the apparatus.

(1) FIG. 21 is a block diagram showing a first variation. In this arrangement, press units 21 to 23 for executing cutting and press units 24 to 26 for executing bending are arranged between a loader 29 and an unloader 30. Further, a test step unit 39 is set between the press units 23 and 24.

This test step unit 39 distinguishes non-defectives from defectives as to completely cut semiconductor devices by inspecting electrical properties, for example, and carries only the non-defectives to subsequent bending steps. Thus, it is possible to omit a meaningless operation of bending the defectives.

Figure 22:
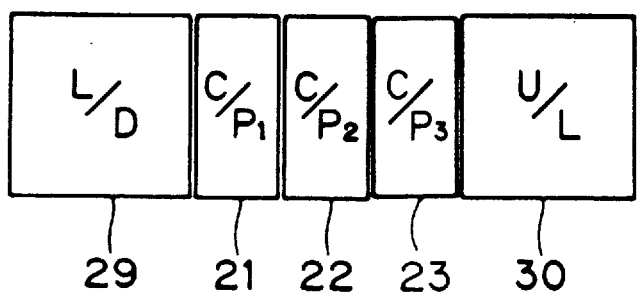
FIG. 22 is a block diagram showing a variation of the arrangement of the apparatus.

(2) FIG. 22 is a block diagram showing a second variation. This arrangement shows an exemplary cutting-dedicated apparatus in which only press units 21 to 23 for cutting are arranged between a loader 29 and an unloader 30. In this arrangement, completely cut semiconductor devices are stored in a product storage pallet 97 as products.

Figure 23:
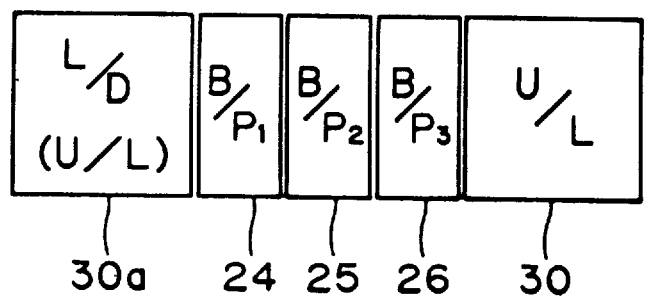
FIG. 23 is a block diagram showing a variation of the arrangement of the apparatus.

(3) FIG. 23 is a block diagram showing a third variation. This arrangement shows an exemplary bending-dedicated apparatus in which only press units 24, 25 and 26 for bending are arranged between a loader 30a and an unloader 30. In this arrangement, the loader 30a supplies completely cut semiconductor devices such as those stored in the product storage pallet 97 in the cutting-dedicated apparatus shown in FIG. 22, for example.

Figure 24:
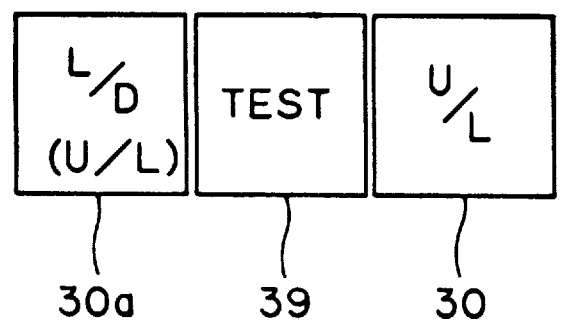
FIG. 24 is a block diagram showing a variation of the arrangement of the apparatus.

(4) FIG. 24 is a block diagram showing a fourth variation. This arrangement shows an exemplary test step-dedicated apparatus in which only a test step unit 39 is set between a loader 30a and an unloader 30. In this arrangement, the loader 30a supplies completely cut semiconductor devices such as those stored in the product storage pallet 97 in the cutting-dedicated apparatus shown in FIG. 22, for example. The test step unit 39 distinguishes non-defectives from defectives as to the completely cut semiconductor devices. Only the non-defectives are stored in a product storage pallet 97 of the unloader 30.

It is also possible to bend the non-defectives by supplying the semiconductor devices serving as the non-defectives stored in the product storage pallet 97 to the loader 30a shown in FIG. 23.

<C. Third Embodiment: Another Example of Die Set of Press Unit>

Description is now made on another example of the characteristic structure of the die set forming the principal part of each of the press units 21 to 27 which are suitable for the apparatus 100.

<C-1. Structure and Operation of Die Set>

Figure 25:
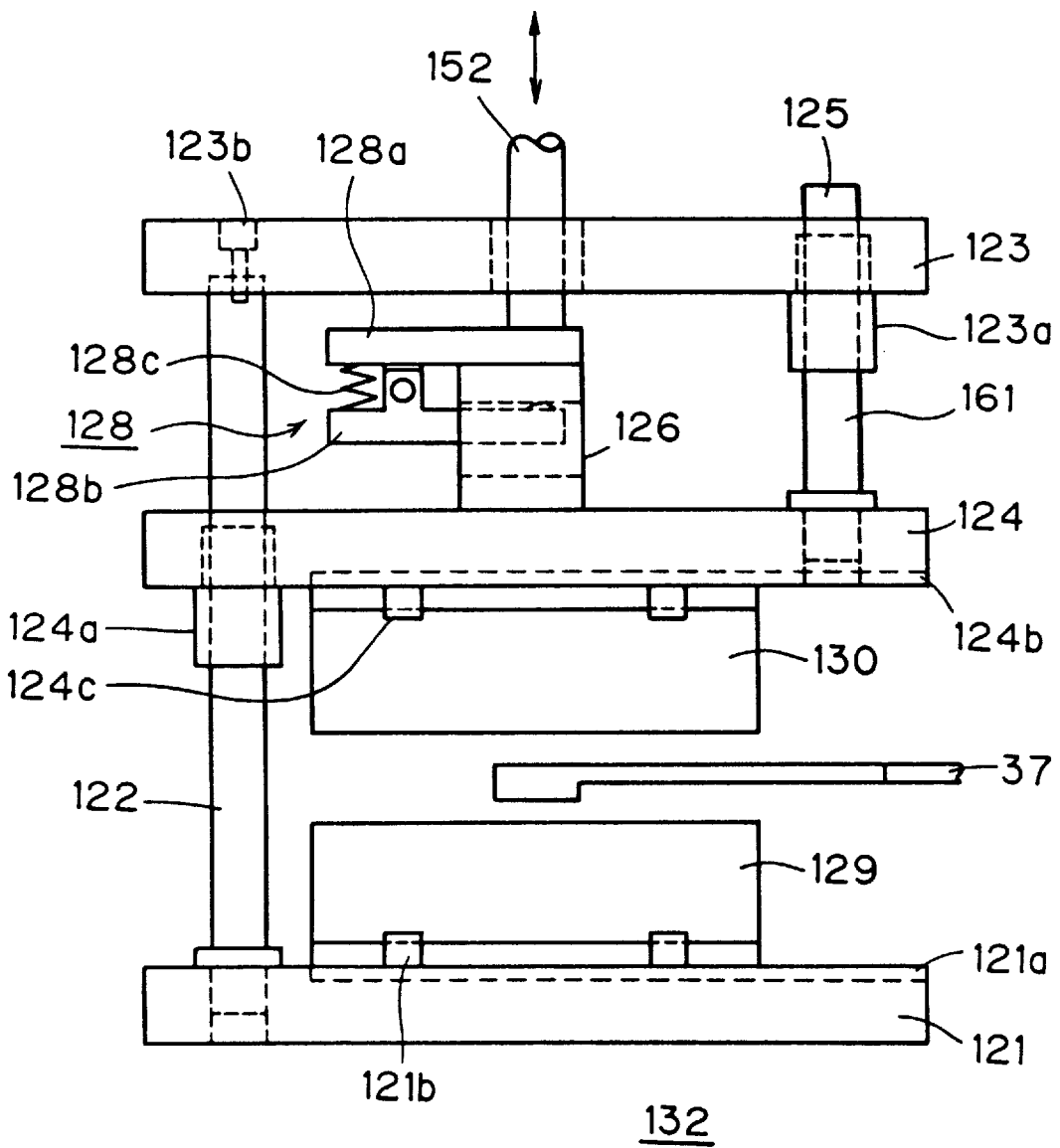
FIG. 25 is a side elevational view showing a die set according to a third embodiment of the present invention.
Figure 26:
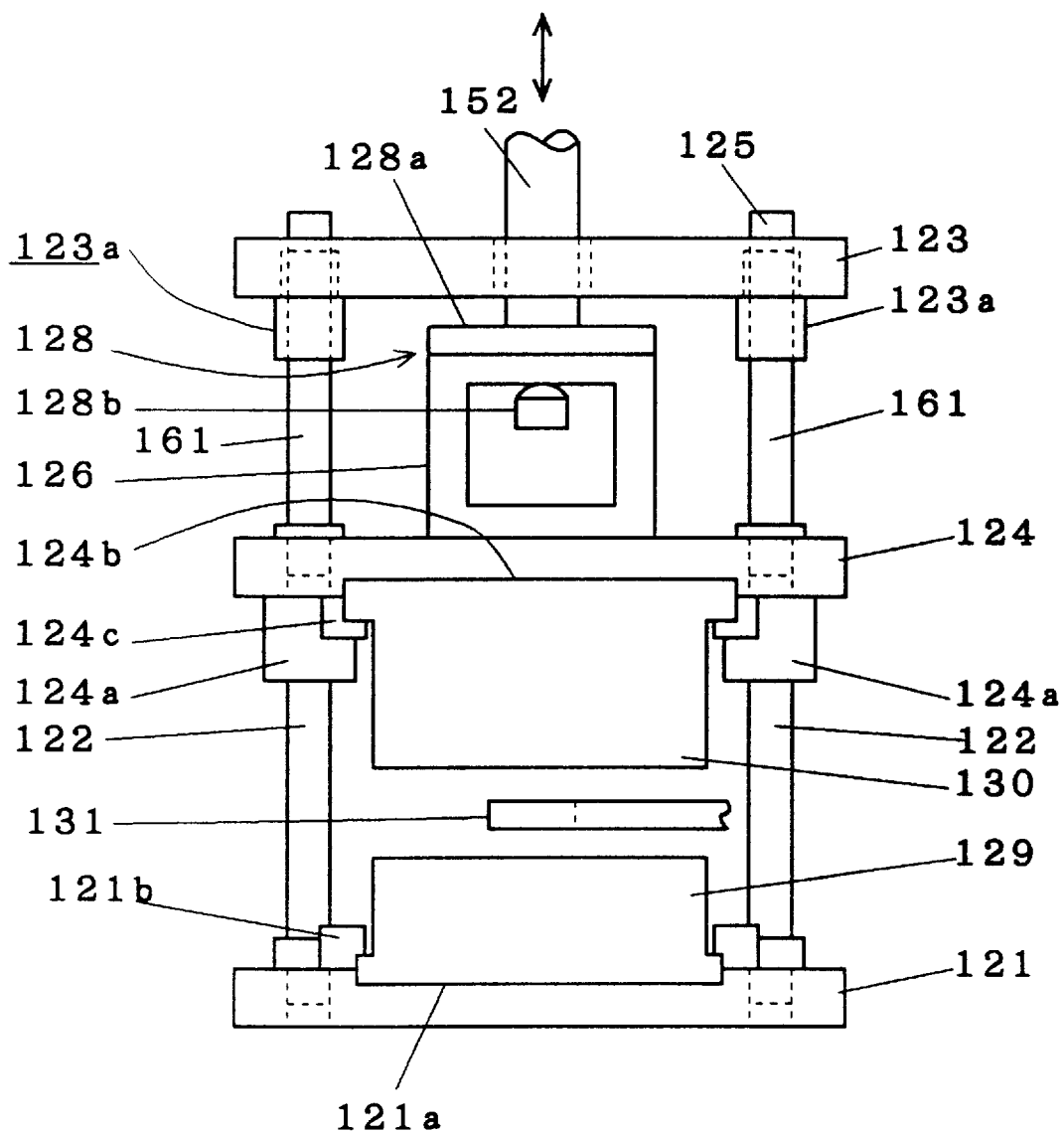
FIG. 26 is a front elevational view of the die set shown in FIG. 25.

FIGS. 25 and 26 are a side elevational view and a front elevational view of a die set 132 according to this embodiment respectively. As shown in FIGS. 25 and 26, a lower mold 129 is mounted on the upper surface of a flat plate type lower mold holder 121. The lower mold 129 is engaged with a groove 121a which is formed in the upper surface of the lower mold holder 121, to be located on a prescribed position of the lower mold holder 121. An extension which is formed on the bottom portion of the lower mold 129 is suppressed by a lower mold clamper 121b, whereby the lower mold 129 is fixed to the lower mold holder 121.

Lower ends of two guide posts 122 vertically extending at the back of the lower mold 129 (left side in FIG. 25) are fixed to the lower mold holder 121. A flat plate type upper support member 123 is fixed to the upper ends of the guide posts 122. The upper ends of the guide posts 122 are engaged with holes provided in the upper support member 123 and fastened by bolts 123b, whereby the guide posts 122 and the upper support member 123 are fixed to each other. Two through holes are provided in front of the upper support member 123 (right side in FIG. 25), so that guide bushes 123a are press-fitted in these through holes.

The guide posts 122 support an upper mold holder 124 to be axially slidable in the vertical direction. The upper mold holder 124 is provided with two through holes, so that smooth sliding between the upper mold holder 124 and the guide posts 122 is implemented by guide pushes 124a which are press-fitted in the through holes.

An upper mold 130 is mounted on the lower surface of the upper mold holder 124. The upper mold 130 is engaged with a groove 124b which is formed in the lower surface of the upper mold holder 124, to be located on a prescribed position of the upper mold holder 124. An extension which is formed on the bottom portion (upper surface in FIG. 25) of the upper mold 130 is suppressed by an upper mold clamper 124c, whereby the upper mold 130 is fixed to the upper mold holder 124.

Lower ends of two vertically upwardly extending guide posts 161 are fixed in front of the upper mold holder 124. The guide posts 161 are slidably supported by the guide bushes 123a. Namely, the upper mold holder 124 is vertically slidably supported by the four guide posts 122 and 161.

The upper support member 123 is provided in its central portion with a through hole, so that a ball screw 152 is freely received in this through hole. A holder 128 is mounted on the lower end of the ball screw 152. Further, a rectangular frame shaped connecting member 126 is mounted on the upper surface of the upper mold holder 124. The ball screw 152 and the upper mold holder 124 are detachably connected with each other by the holder 128 and the connecting member 126.

The holder 128 has a mounting plate 128a, a holding lever 128b which is rotatably supported on the bottom surface of the mounting plate 128a, and a spring (elastic body) 128c urging the holding lever 128b. The mounting plate 128a is fixed to the lower end of the ball screw 152. The holding lever 128b is inserted in a hollow portion of the connecting member 126 to apply elastic restoring force of the spring 128c, whereby the upper surface portion of the connecting member 126 is pressed/held by the mounting plate 128a and the holding lever 128b. It is possible to detach the holder 128 and the connecting member 126 from each other by opening the holding lever 128b against the elastic restoring force of the spring 128c.

Vertically downwardly directed pressing force which is applied by a press motor 85a to the ball screw 152 is transferred to the mounting plate 128a, and further transferred to the upper mold holder 124 through the connecting member 126. Consequently, the upper and lower molds 130 and 129 are closed with the pressing force through a lead frame 34 which is a workpiece.

In order to release the upper and lower molds 130 and 129, a vertical upward movement of the ball screw 152 is transmitted to the mounting plate 128a and further to the connecting member 126 through the holding lever 128b. Thus, vertical reciprocation of the ball screw 152 is transmitted to the upper mold holder 124 through the holder 128 and the connecting member 126, thereby implementing closure and release of the upper and lower molds 130 and 129. Strength of the spring 128c is properly set so that the mounting plate 128a is regularly in contact with the upper surface of the connecting member 126 during the reciprocation.

Figure 27:
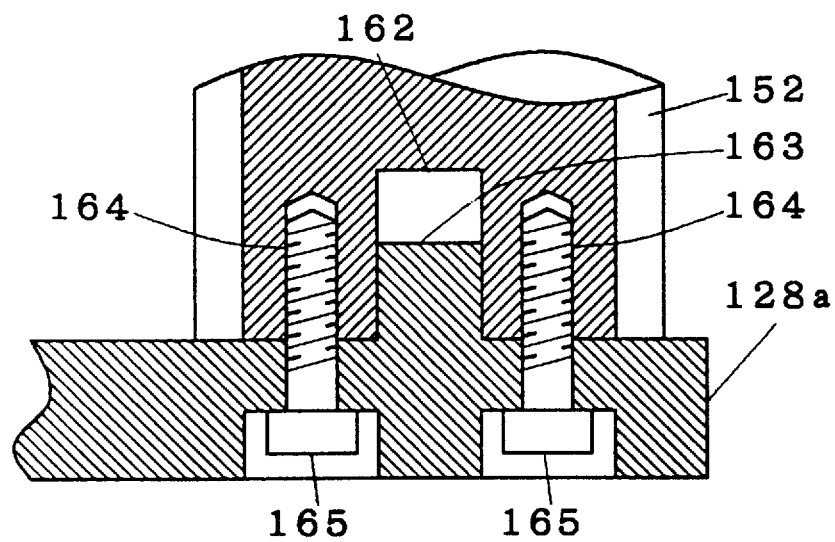
FIG. 27 is a sectional view showing a connecting portion between a holder and a ball screw shown in FIG. 25.
Figure 28:
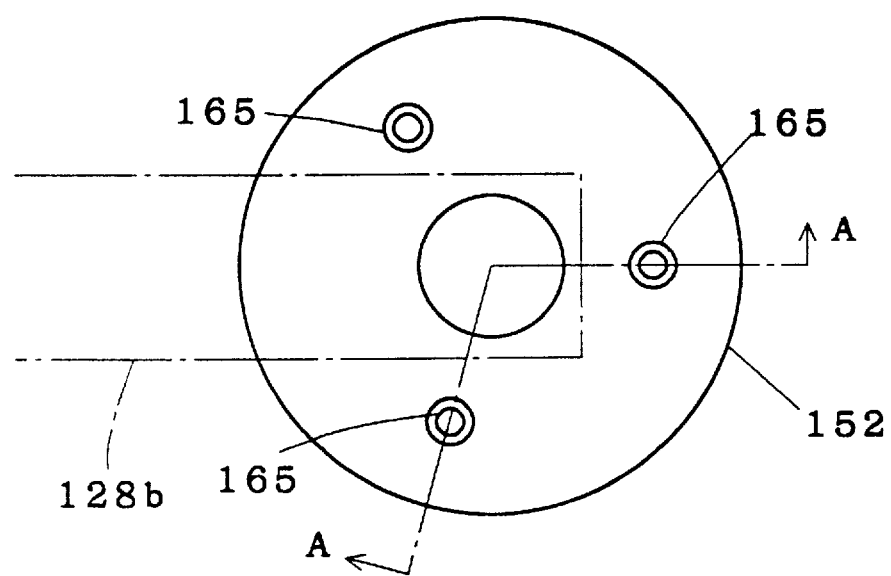
FIG. 28 is a plan view showing the connecting portion between the holder and the ball screw shown in FIG. 25.

FIG. 27 is a sectional view showing the lower end of the ball screw 152 and the mounting plate 128a. FIG. 28 is a bottom plan view of the ball screw 152. The sectional view of FIG. 27 is taken along the line A—A in FIG. 28. As shown in FIG. 27, a hole 162 is provided in the center of the bottom surface of the ball screw 152. On the other hand, a projection 163 is formed on the upper surface of the mounting plate 128a. The projection 163 is engaged with the hole 162, thereby properly positioning the ball screw 152 and the mounting plate 128a.

Further, the mounting plate 128a and the ball screw 152 are fastened with each other by bolts 165. The head portions of the bolts 165 are stored in holes which are provided in the bottom surface of the mounting plate 128a, not to interfere with the upper surface of the connecting member 126. As shown in FIG. 28, further, the holes for receiving the bolts 165 are selectively formed in positions not covered with the holding lever 128b. Thus, it is possible to mount and detach the holder 128 on and from the ball screw 152 without decomposing the holder 128.

Figure 29:
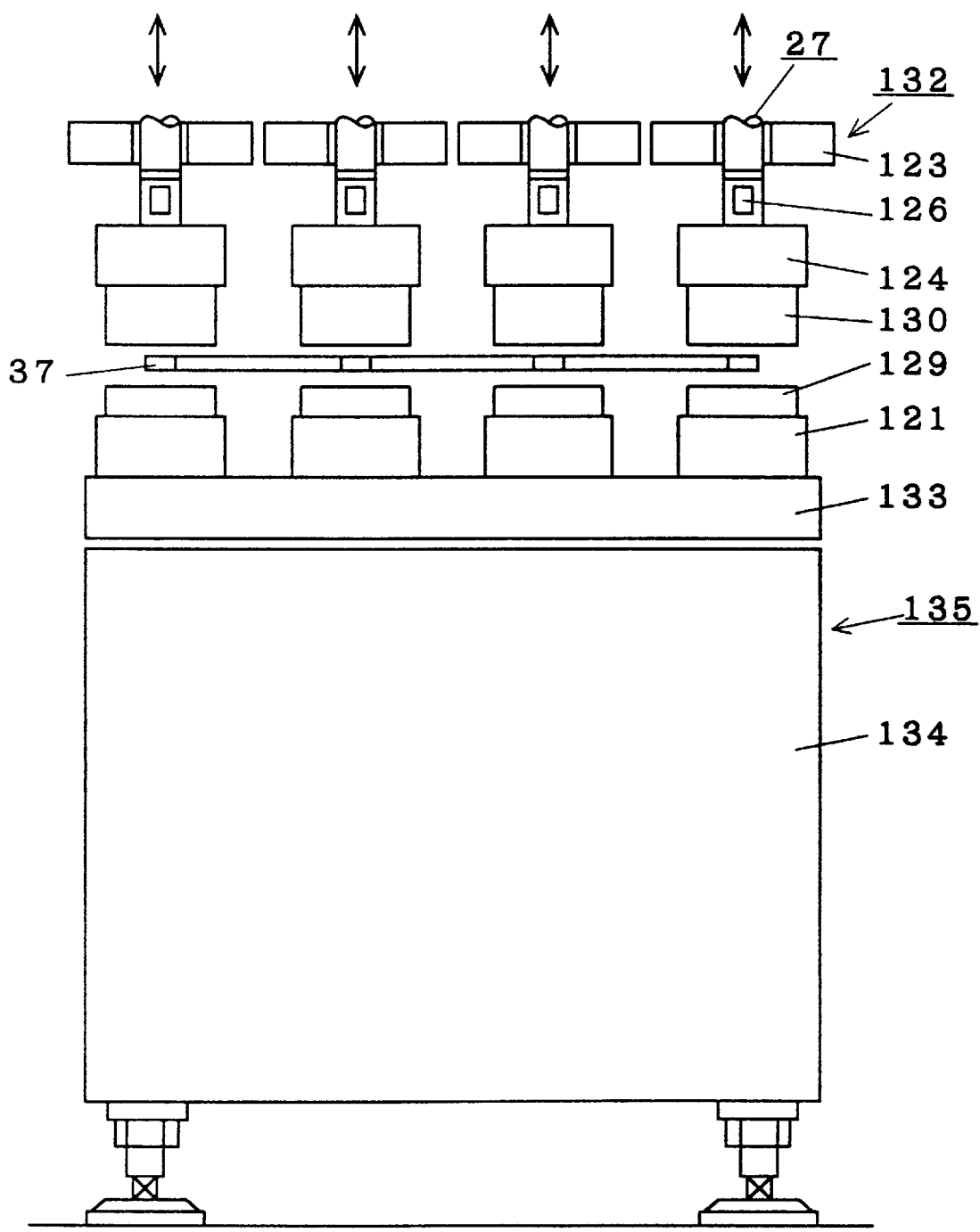
FIG. 29 is a front elevational view of a molding/working apparatus comprising the die set shown in FIG. 25.

FIG. 29 is a front elevational view showing a lead frame molding apparatus 135 in which four die sets 132 are integrated. The four die sets 132 are mounted on a common surface plate 133 to be aligned with each other at regular intervals. The surface plate 13 is fixed on a rack 134. The lead frame molding apparatus 135 corresponds to an apparatus obtained by integrating the die sets 132 in four press units 24 to 27, for example. An internal conveyor unit comprising an arm 37 is set on the surface plate 133 in front of the four die sets 132.

<C-2. Advantages of Die Set 32>

Also in each of the die sets 132 according to this embodiment, two guide posts 122 are provided rearwardly beyond a prescribed portion of a lower mold 129 receiving a lead frame 34 which is a workpiece, i.e., rearwardly beyond a pressing force center, as viewed from the side provided with the internal conveyor unit, and no members for supporting the upper mold holder 124 are provided in front thereof. Namely, no member interferes with the operation of the arm 37 which is inserted in a clearance between the upper and lower molds 130 and 129. Thus, it is possible to integrate the internal conveyor unit in the lead frame molding apparatus 135.

In this die set 132, further, the upper mold holder 124 is slidably supported by four guide posts 122 and 161, which are provided in positions corresponding to four corners of a square substantially about the pressing force center (i.e., the central axis of the ball screw 152), i.e., the portion provided with the lead frame which is the workpiece. Thus, bending moment caused in the guide posts 122 and 161 following reciprocation of the ball screw 152 is eliminated or canceled.

Thus, it is possible to eliminate or cancel such problems that the guide posts 122 and 161 are bent/deformed, the space between the upper and lower molds 130 and 129 cannot be maintained uniform and working accuracy for the workpiece is deteriorated. Namely, each die set 132 compatibly implements integration of the internal conveyor unit and prevention of bending of the guide posts.

The guide posts 122 serve both as members fixedly connecting the lower mold holder 121 with the upper support member 123 and those slidably supporting the upper mold holder 124. Thus, the die set 132 is simpler in structure and lower in fabrication cost as compared with that separately provided with these members.

Further, it is not necessary to set a press ram 84a and a ram guide 153 for guiding the ball screw 152 since the guide posts 122 and 161 are not bent/deformed. Namely, it is possible to reduce the fabrication cost for each press unit by bringing the same into a simple ram-free structure.

When it is necessary to exchange the upper and lower molds 130 and 129 in response to change of the type of the semiconductor devices to be fabricated, these molds can be readily exchanged by releasing the lower and upper mold clampers 121*b* and 124*c*. Namely, it is not necessary to exchange the overall die set 132.

Further, the ball screw 152 and the upper mold holder 124 are connected with each other through the holder 128 and the connecting member 126, with no employment of a shank 83*a* and a shank holder 82*a*. Therefore, no such problem is caused that an impact load is applied to a top portion of a flange member due to play between the flange member of the shank 83*a* and the shank holder 82*a* to quickly wear this portion.

<D. Fourth Embodiment: Still Another Example of Die Set of Press Unit>

Figure 30:
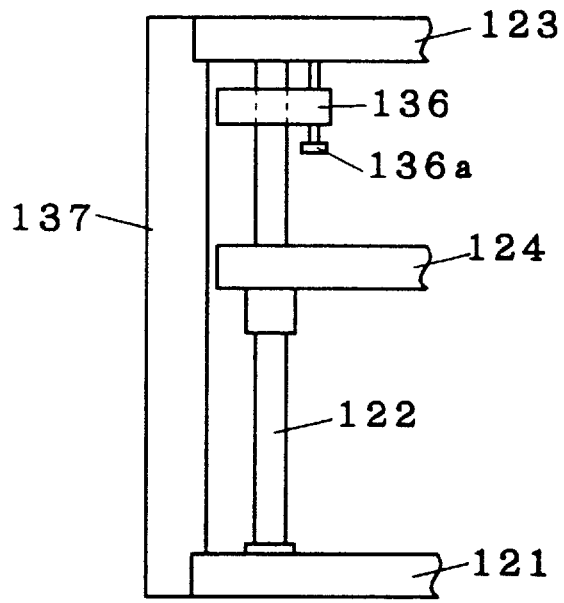
FIG. 30 is a partial side elevational view showing a die set according to a fourth embodiment of the present invention.

FIG. 30 is a partially fragmented side elevational view showing still another exemplary die set which is suitable for each of the press units 21 to 27. An upper mold 130, a lower mold 129, a connecting member 126, a holder 128 and an arm 37 are not illustrated in this figure.

As shown in FIG. 30, a connecting plate 137 is provided between a lower mold holder 121 and an upper support member 123 in this die set. The upper and lower ends of the connecting plate 137 are fixed to the upper support member 123 and the lower mold holder 121 respectively. Thus, the connecting plate 137 serves as a reinforce for regularly maintaining the upper support member 123 and the lower mold holder 121 in parallel with each other. Further, the connecting plate 137 is mounted on a portion rearward (left side in FIG. 30) beyond a prescribed portion on the lower mold 129 receiving a workpiece, not to interfere with the operation of an arm 37 which is inserted in a clearance between upper and lower molds 130 and 129.

Figure 31:
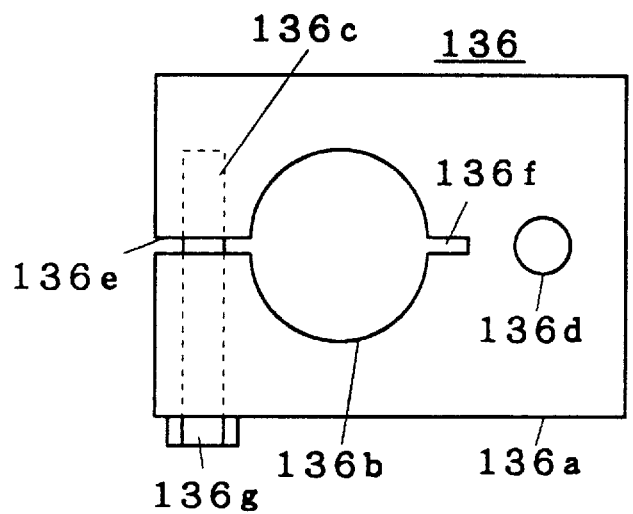
FIG. 31 is a plan view of a reinforce shown in FIG. 30.

This die set is further provided with a reinforce 136 serving as another reinforcing member. FIG. 31 is a plan view of this reinforce 136. As shown in FIG. 31, a through hole 136*b* is provided in a central portion of a metal flat plate in the reinforce 136, while expanding slots 136*e* and 136*f* are formed to communicate with the through hole 136*b* while diametrally crossing this through hole 136*b*. Further, a screw hole 136*c* is formed to cross the expanding slot 136*e*, so that a bolt 136*g* is fitted with this screw hole 136*c*. In addition, another screw hole 136*d* is formed to pass through the metal flat plate in parallel with the through hole 136*b*.

As shown in FIG. 30, the reinforce 136 is mounted on a guide post 122 in a position upward beyond the upper mold holder 124 and in proximity to the upper support member 123. The screw hole 136*b* is directed to be positioned frontwardly (right side in FIG. 30) beyond the guide post 122, the guide post 122 is held by the through hole 136*b* and the bolt 136*g* which is fitted with the screw hole 136*c* is tightened, thereby fixing the reinforce 136. The bolt 136*a* is fitted with the screw hole 136*d* from below, so that the forward end of the bolt 136*a* comes into contact with the bottom surface of the upper support member 123. It is possible to suppress displacement of the upper support member 123 for maintaining the same in parallel with the lower mold holder 121, by bringing the bolt 136*a* into contact therewith with a constant degree of pressing force.

While this embodiment is provided with two types of reinforcing members including the connecting plate 137 and the reinforce 136, only one of these members can alternatively be provided.

<E. Fifth Embodiment: Further Example of Die Set for Press Unit>

Figure 32:
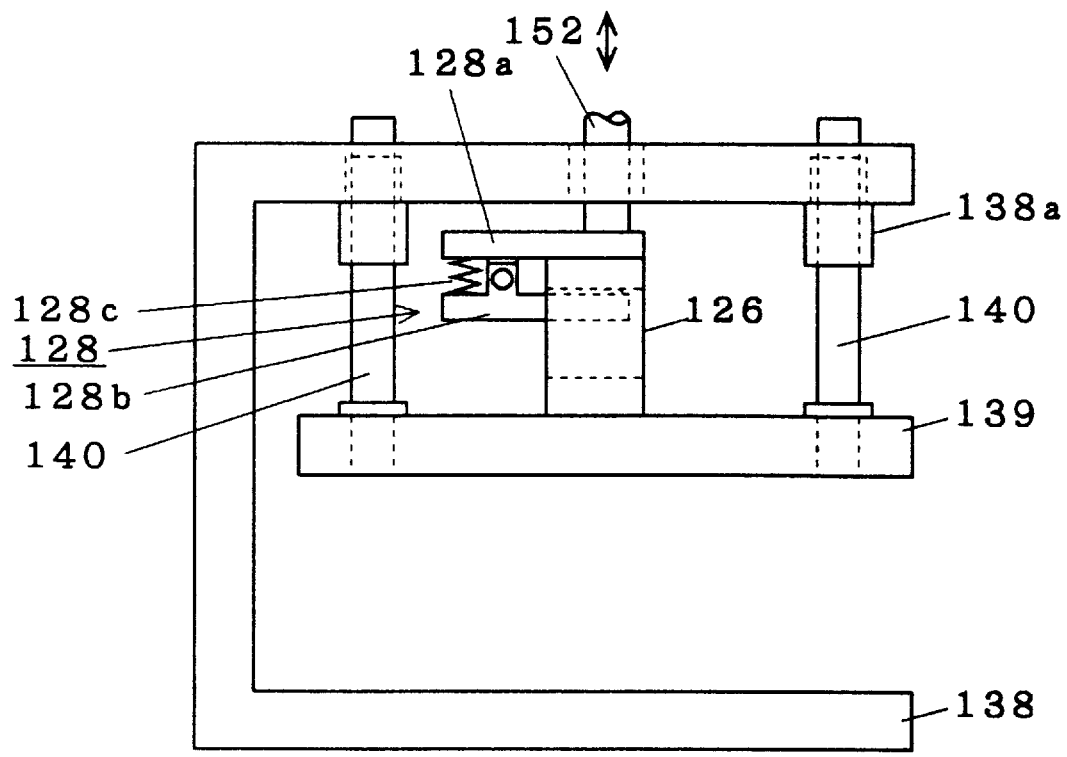
FIG. 32 is a side elevational view showing a die set according to a fifth embodiment of the present invention.

FIG. 32 is a partially fragmented side elevational view showing a further exemplary die set which is suitable for each of press units 21 to 27. An upper mold, a lower mold 129 and an arm 37 are not shown in this figure.

As shown in FIG. 32, this die set comprises a support member 138 which is integrally molded substantially in a U-shaped manner. In this support member 138, upper and lower flat end members which are parallel to each other are integrally connected with each other by a flat back member. The lower member is similar in structure to the lower mold holder 121 of the die set 132, so that the lower mold 129 (not shown) is exchangeably mounted thereon.

Figure 33:
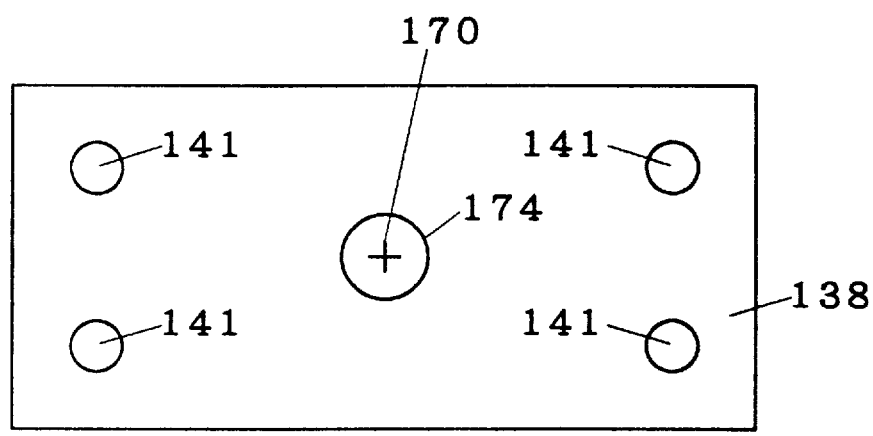
FIG. 33 is a plan view of the die set shown in FIG. 32.

FIG. 33 is a plan view showing the upper end member of the support member 138. As shown in FIG. 33, a through hole 174 is provided in the central portion of the upper end member, for freely receiving a ball screw 152. Further, four through holes 141 are formed in positions corresponding to four corners of a square substantially about a pressing force center 170 corresponding to the central axis of the ball screw 152. Guide pushes 138*a* are press-fitted in the four through holes 141 respectively.

The lower ends of four guide posts 140 are fixed to the upper mold holder 139, so that the guide posts 140 are slidably supported by the guide bushes 138*a*. A connecting member 126 is fixed to the upper surface of the upper mold holder 139 similarly to the upper mold holder 124 (FIG. 25), so that the ball screw 152 and the upper mold holder 139 are detachably connected with each other through the connecting member 126 and a holder 128. The upper mold 130 (not shown) is exchangeably mounted on the lower surface of the upper mold holder 139, in a similar manner to the upper mold holder 124 (FIG. 25).

In the die set according to this embodiment, the support member 138 is formed in a U-shaped manner and the upper and lower end members are connected with each other by the back member which is arranged rearwardly beyond a prescribed portion of the lower mold 129 receiving the workpiece, whereby no member interferes with an operation of the arm 37 which is inserted in a clearance between the upper and lower molds 130 and 129. Thus, this die set can be employed with an internal conveyor unit.

In this die set, further, the upper mold holder 139 is slidably supported by the four guide posts 140, which are provided on the positions corresponding to the four corners of the square substantially about the pressing force center 170 as viewed from above. Thus, bending moment caused in these guide posts 140 following reciprocation of the ball screw 152 is so eliminated or canceled that the upper and lower end members are regularly maintained in parallel with each other. This brings improvement of working accuracy and enables implementation of the press unit in a ram-free structure.

In this die set, in addition, the lower end member serving as a fixed mold holder, the back member serving as a connecting member and the upper end member serving as a support member are integrally molded with each other, whereby the fixed mold holder and the support member are strongly connected with each other. Thus, displacement of the support member following pressing of the upper mold holder 139 is further suppressed. This also contributes to improvement of the working accuracy.

<F. Sixth Embodiment: Further Example of Die Set for Press Unit>

Figure 34:
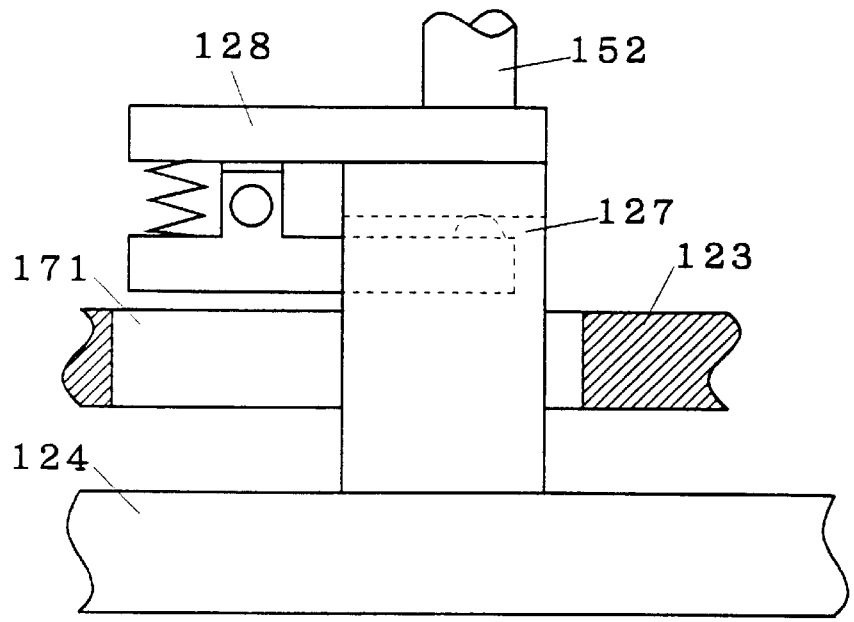
FIG. 34 is a partial sectional view showing a die set according to a sixth embodiment of the present invention.

FIG. 34 is a sectional view showing another example of the upper support member 123 in the third or fourth embodiment. An upper support member 123 according to this embodiment is provided with an opening 171 which can pass a holder 128 therethrough in a state connected with a connecting member 126. Therefore, it is possible to readily detach the holder 128 from the connecting member 126 by pulling the holder 128 upwardly beyond the upper support member 123 through the opening 171.

It is also possible to provide such an opening 171 in the upper end of the support member 138 provided in the fifth embodiment.

<G. Seventh Embodiment: Further Example of Die Set for Press Unit>

Figure 35:
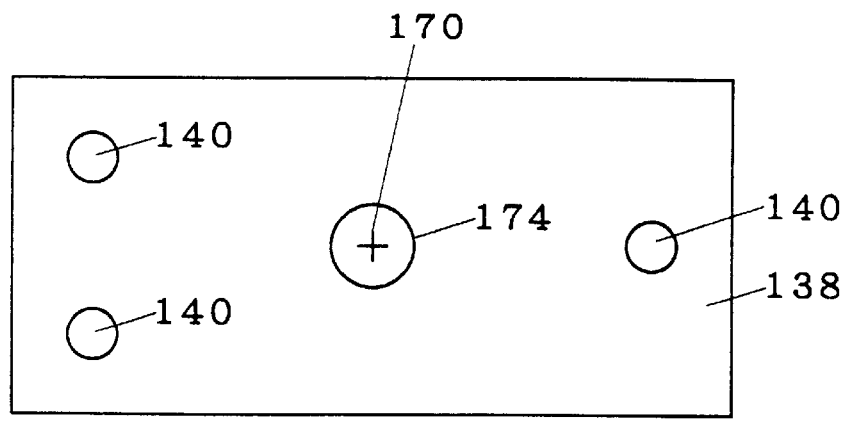
FIG. 35 is a plan view showing a die set according to a seventh embodiment of the present invention.
Figure 36:
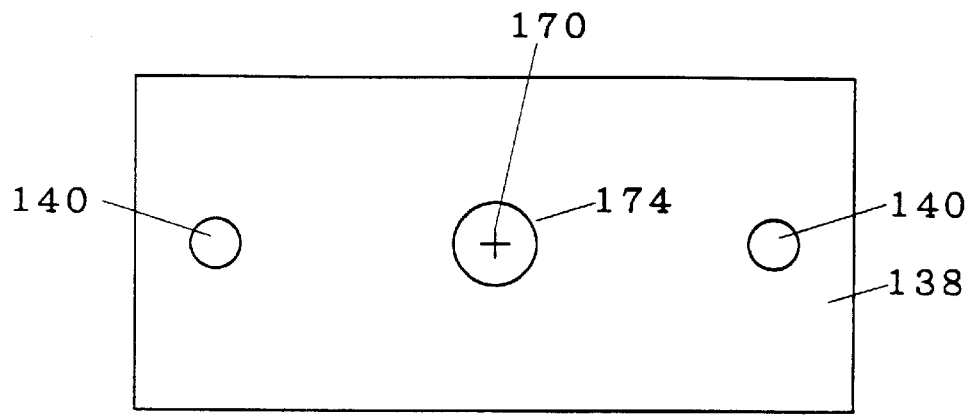
FIG. 36 is a plan view showing another exemplary die set according to the seventh embodiment of the present invention.
Figure 37:
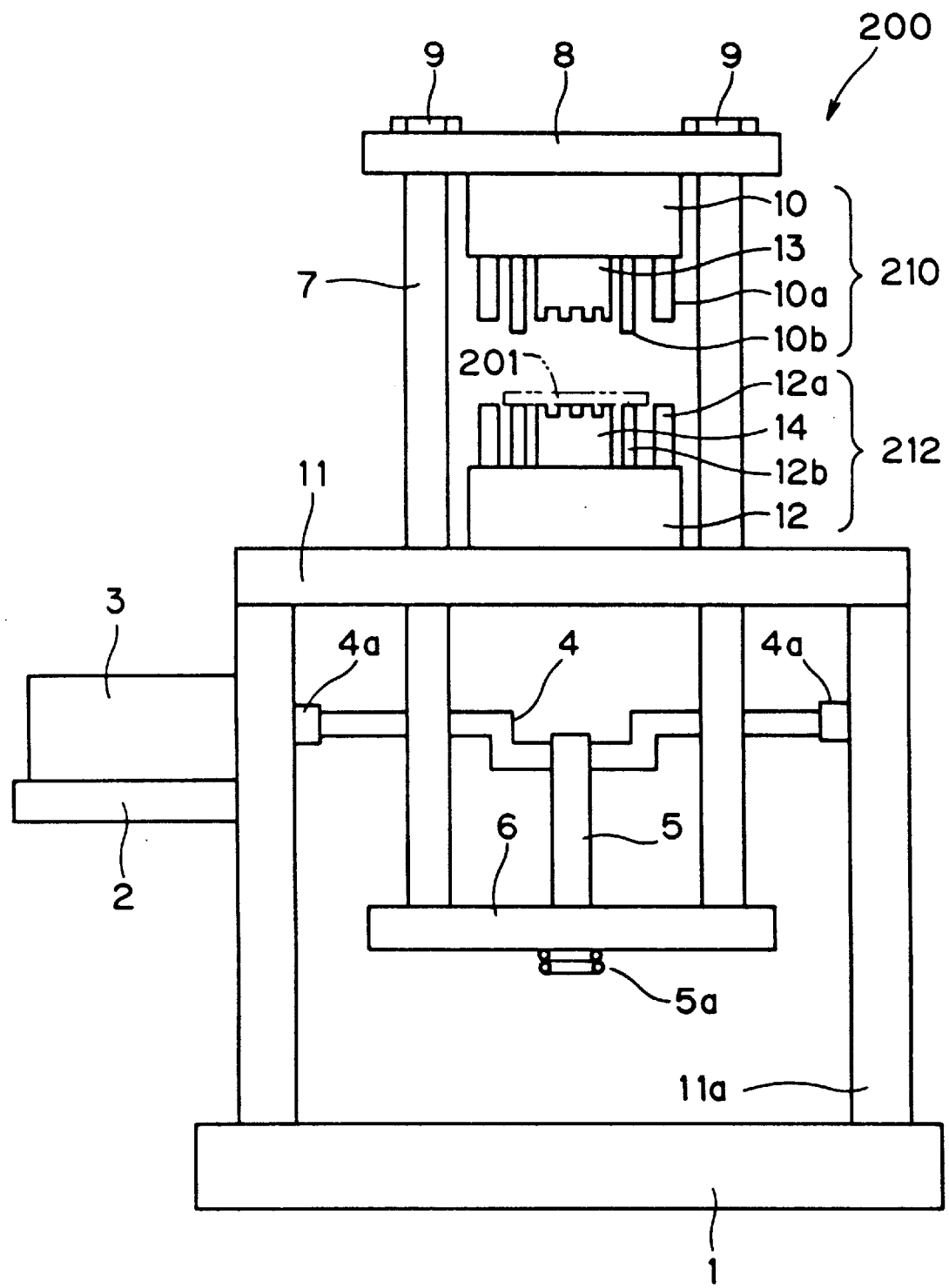
FIG. 37 is a front elevational view of a conventional apparatus for fabricating semiconductor devices.
Figure 38:
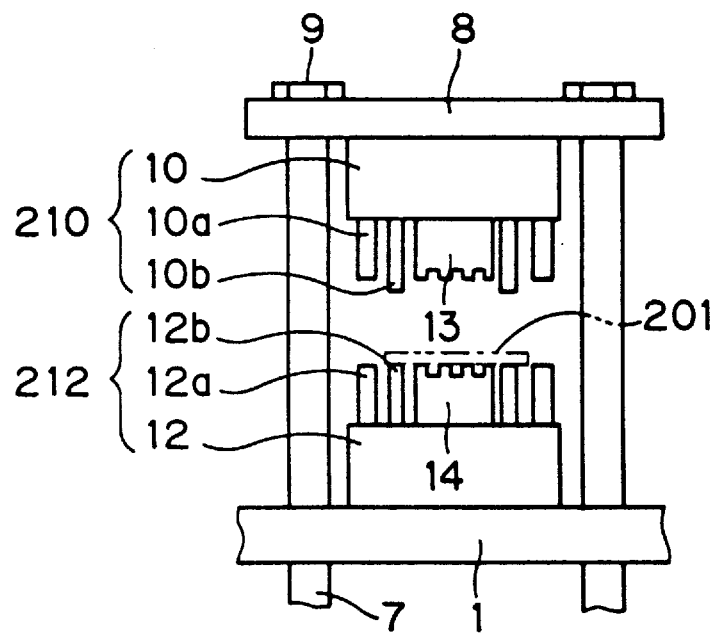
FIG. 38 is an operation explanatory diagram showing the operation of the apparatus shown in FIG. 37.
Figure 39:
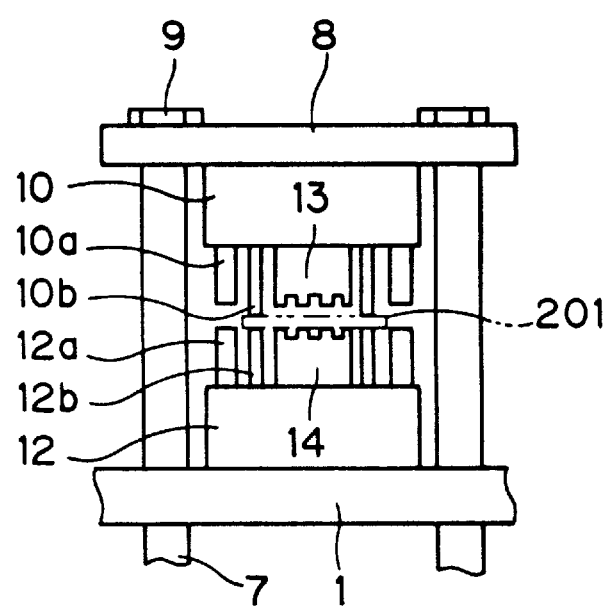
FIG. 39 is an operation explanatory diagram showing the operation of the apparatus shown in FIG. 37.
Figure 40:
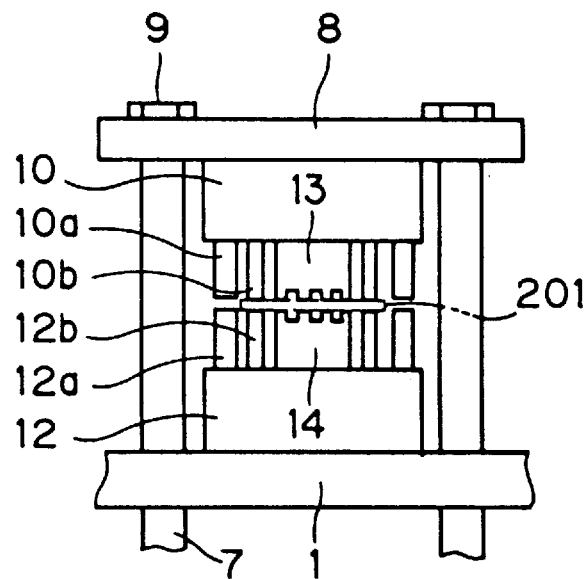
FIG. 40 is an operation explanatory diagram showing the operation of the apparatus shown in FIG. 37.
Figure 41:
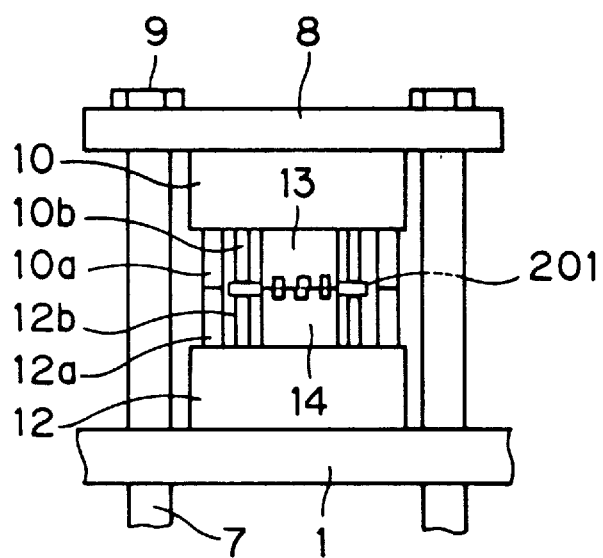
FIG. 41 is an operation explanatory diagram showing the operation of the apparatus shown in FIG. 37.

While the die set according to the fifth embodiment is provided with the four guide posts 140 slidably supporting the upper mold holder 139, the number of the guide posts 140 is not restricted to four. As shown in a plan view of FIG. 35 showing an upper end portion of a support member 138, for example, guide posts 140 may be arranged on three portions corresponding to three corners of a triangle which is substantially about a pressing force center 170. Alternatively, guide posts 140 may be arranged on two portions corresponding to both ends of a line substantially about a pressing force center 170, as shown in FIG. 36. Also in each of these examples, the guide posts 140 are inhibited from generation of moment following a movement of a ball screw 152, whereby upper and lower end members of the support member 138 are maintained in parallel with each other.

In general, an effect similar to the above is attained so far as guide posts 140 are arranged on positions corresponding to corners of a polygon which is substantially about a pressing force center 170. In other words, the guide posts 140 may be arranged on positions putting the pressing force center 170 therebetween or surrounding the same 170, substantially at a center thereof. While modifications of the positions of the guide posts with reference to the sixth embodiment are herein described, similar modifications may be possible also as to the positions of the guide posts 122 and 161 in the third or fourth embodiment. For example, three guide posts including two guide posts 122 and one guide post 161 may be arranged as shown in FIG. 35.

While the invention has been shown and described in detail, the foregoing description is in all aspects illustrative and not restrictive. It is therefore understood that numerous modifications and variations can be devised without departing from the scope of the invention.

What is claimed is:

1. An apparatus for fabricating semiconductor devices, being adapted to press work a lead frame being formed by integrally connecting a plurality of elemental leads each serving as a material for the lead of a single semiconductor device with each other while completely being sealed together with semiconductor chips mounted thereon, said apparatus comprising a plurality of press working means, each of said plurality of press working means comprising at least a pair of molds carrying out press working on said lead frame by holding and pressing the same, said apparatus further comprising conveyor means for successively transferring said lead frame in units of said elemental leads to a plurality of prescribed portions including portions, receiving said lead frame, of a plurality of pairs of molds from an initial stage to a final stage belonging to said plurality of press working means, said initial stage of said plurality of pairs of molds carrying out press working of separating said lead frame into respective said elemental leads by cutting said lead frame, said conveyor means successively transferring said lead frame in units of said elemental leads that or to those of said plurality of prescribed portions following that belonging to said initial stage of said plurality of pairs of molds, said lead frame being press worked in units of said elemental leads in stages following said initial stage of said plurality of pairs of molds.

2. The apparatus for fabricating semiconductor devices in accordance with claim 1, wherein each of said plurality of press working means further comprises a press power source applying pressing force to said at least a pair of molds.

3. The apparatus for fabricating semiconductor devices in accordance with claim 2, further comprising control means, said control means controlling said press power source so that each of said plurality of press working means carries out press working in correspondence to type and structure of said semiconductor devices on the basis of a previously provided variety signal expressing information on said type and structure.

4. The apparatus for fabricating semiconductor devices in accordance with claim 3, wherein each of said plurality of press working means comprises driving means for driving said press power source, and said control means transmits a signal indicating press working conditions to said driving means, said driving means driving said press power source to satisfy said press working conditions on the basis of said signal.

5. The apparatus for fabricating semiconductor devices in accordance with claim 3, further comprising thickness detection means detecting the thickness of said lead frame and transmitting a signal expressing said thickness to said control means, said control means controlling said press power source so that each of said plurality of press working means carries out said press working in correspondence to said type, said structure and said thickness on the basis of said variety signal and said signal.

6. The apparatus for fabricating semiconductor devices in accordance with claim 3, further comprising loading means for supplying said lead frame from a storage vessel receiving said lead frame to said initial stage of said plurality of pairs of molds, wherein a recording medium recording the type of said semiconductor devices is attached to said storage vessel, said loading means comprises read means for reading said type being recorded in said recording medium and transmitting a signal expressing said type to said control means, and said control means compares said variety signal with said signal thereby deciding whether or not the type of said lead frame being received in said storage vessel is erroneous and displaying the result.

7. The apparatus for fabricating semiconductor devices in accordance with claim 2, wherein said press power source comprises:

an electric rotary motor generating torque, and means for converting said torque of said electric rotary motor to said pressing force being applied to said at least a pair of molds by a ball screw being directly connected to a rotary shaft of said electric rotary motor.

8. The apparatus for fabricating semiconductor devices in accordance with claim 1, wherein said conveyor means comprises an arm for supporting and transferring said elemental leads by sucking the surface of a sealing body sealing said semiconductor chips.

9. The apparatus for fabricating semiconductor devices in accordance with claim 8, wherein
said conveyor means comprises guide means for guiding said sealing body to be capable of supporting said elemental leads on a prescribed portion of said arm.

10. The apparatus for fabricating semiconductor devices in accordance with claim 1, wherein
said plurality of pairs of molds repetitively carry out pressing and releasing in synchronization with each other,
said conveyor means repetitively simultaneously transferring a plurality of said elemental leads being placed on said plurality of prescribed portions every released period of said plurality of pairs of molds.

11. The apparatus for fabricating semiconductor devices in accordance with claim 10, wherein
the number of said plurality of prescribed portions is at least 3, said plurality of prescribed portions being arranged on a straight line at regular intervals.

12. An apparatus for fabricating semiconductor devices being adapted to carry out press working on a lead frame completely being sealed together with semiconductor chips mounted thereon, said apparatus comprising a plurality of press working means,
each of said plurality of press working means comprising at least a pair of molds carrying out press working on said lead frame by holding and pressing the same, a press power source applying pressing force to said at least a pair of molds, and driving means for driving said press power source,
said apparatus further comprising control means,
said control means transmitting a signal indicating press working conditions corresponding to type and structure of said semiconductor devices on the basis of a previously provided variety signal expressing information on said type and structure to said driving means,
said driving means driving said press power source to satisfy said press working conditions on the basis of said signal.

13. An apparatus for fabricating semiconductor devices being adapted to carry out press working on a lead frame completely being sealed together with semiconductor chips mounted thereon, said apparatus comprising press working means,
said press working means comprising at least a pair of molds carrying out press working on said lead frame by holding and pressing the same, and a press power source applying pressing force to said at least a pair of molds,
said apparatus further comprising control means,
said control means controlling said press power source so that said press working means carry out press working in correspondence to type and structure of said semiconductor devices on the basis of a previously provided variety signal expressing information on said type and structure.

14. The apparatus for fabricating semiconductor devices in accordance with claim 13, further comprising thickness detection means detecting the thickness of said lead frame and transmitting a signal expressing said thickness to said control means,
said control means controlling said press power source so that said press working means carries out said press working in correspondence to said type, said structure and said thickness on the basis of said variety signal and said signal.

15. A method of fabricating semiconductor devices, being adapted to press work a lead frame being formed by integrally connecting a plurality of elemental leads each serving as a material for the lead of a single semiconductor device with each other while completely being sealed together with semiconductor chips mounted thereon, said method comprising:
(a) a step of preparing a plurality of pairs of molds for carrying out press working on said lead frame by holding and pressing the same, including a pair of molds for elemental cutting being capable of cutting said lead frame to separate the same into respective said elemental leads; and
(b) a step of press working said lead frame stepwise by successively employing said plurality of pairs of molds,
said step (b) comprising:
(b-1) a step of cutting said lead frame to separate the same into respective said elemental leads by employing said pair of molds for elemental cutting in advance of all other press working.

16. A method of fabricating semiconductor devices, being adapted to press work a lead frame completely being sealed together with semiconductor chips mounted thereon, said method comprising:
(a) a step of preparing at least a pair of molds being capable of carrying out press working on said lead frame by holding and pressing the same; and
(b) a step of press working said lead frame by pressing said at least a pair of molds for implementing press working corresponding to the type and structure of said semiconductor devices on the basis of information related to said type and structure.

17. The method of fabricating semiconductor devices in accordance with claim 16, further comprising:
(c) a step of detecting the thickness of said lead frame, said step (b) comprising:
(b-1) a step of press working said lead frame by pressing said at least a pair of molds to implement press working corresponding to said type and said structure of said semiconductor devices and said thickness of said lead frame on the basis of said information related to said type and said structure and on the basis of said thickness being detected in said step (c).

18. The apparatus for fabricating semiconductor devices in accordance with claim 1, wherein
at least one of said plurality of press working means further comprises cleaning means for removing unnecessary substances resulting from press working by cleaning that of said elemental leads being placed on one of said plurality of prescribed portions.

19. The apparatus for fabricating semiconductor devices in accordance with claim 18, wherein
said cleaning means comprises:
brush means for separating said unnecessary substances from said elemental leads by brushing said elemental leads, and
air suction means for sucking separated said unnecessary substances and eliminating the same to the exterior by sucking air around said elemental leads being subjected to said brushing.

20. The apparatus for fabricating semiconductor devices in accordance with claim 1, further comprising inspection means for inspecting whether or not press working is normally carried out on that of said elemental leads being placed on at least one of said plurality of prescribed portions while selecting said elemental leads in response to the results of said inspection.

21. The apparatus for fabricating semiconductor devices in accordance with claim 2, wherein
one of said at least a pair of molds being provided in each of said plurality of press working means is of a fixed type and the other one is of a movable type, and
each of said plurality of press working means further comprises:
a drive shaft being provided with said pressing force by said press power source,
a fixed mold holder fixing said fixed mold of said at least a pair of molds,
a plurality of guide posts being uprightly provided on said fixed mold holder,
a movable mold holder being slidably supported by said plurality of guide posts for fixing said movable mold of said at least a pair of molds,
a shank comprising a shaft member projecting from the forward end of said drive shaft in the form of a bar and a flange member being connected to the forward end portion of said shaft member and having a substantially semispherical top portion, and
a shank holder being fixedly mounted on said movable mold holder and having an elongated recess having an open end, said shaft member being inserted in said recess for engaging said flange member with a peripheral edge portion of said recess,
said plurality of guide posts being set only on one side about a virtual plane including that of said plurality of prescribed portions belonging to said at least a pair of molds and parallel to the direction of said pressing force.

22. An apparatus for fabricating semiconductor devices, being adapted to carry out press working on a lead frame completely being sealed together with semiconductor chips mounted thereon by holding the same between fixed and movable molds and pressing the same, said apparatus comprising:
a fixed mold holder being capable of receiving said fixed mold;
a movable mold holder being capable of receiving said movable mold;
a support member being opposed to said fixed mold holder through said movable mold holder and fixedly connected to said fixed mold holder through a connecting member; and
a plurality of guide posts slidably supporting said movable mold holder on said support member in a direction opening/closing said fixed mold being mounted on said fixed mold holder and said movable mold being mounted on said movable mold holder,
said connecting member being set only on one side about a virtual plane including portions of said fixed mold being mounted on said fixed mold holder and said movable mold being mounted on said movable mold holder receiving said lead frame and parallel to said opening/closing direction,
said plurality of guide posts being arranged on positions putting said portions therebetween or surrounding the same substantially at a center thereof as viewed along said opening/closing direction, that or those of said plurality of guide posts being arranged at least on the other side of said virtual plane being not provided between said movable mold holder and said fixed mold holder.

23. The apparatus for fabricating semiconductor devices in accordance with claim 22, wherein
the number of said plurality of guide posts is at least 3,
at least two said guide posts other than at least one of said plurality of guide posts being arranged on said one side and fixedly connecting said support member and said fixed mold holder with each other for serving also as said connecting member.

24. The apparatus for fabricating semiconductor devices in accordance with claim 22, wherein
the number of said plurality of guide posts is at least 3,
at least two said guide posts other than at least one of said plurality of guide posts being arranged on said one side and fixedly connecting said support member and said fixed mold holder with each other,
said connecting member being provided independently of said at least two guide posts.

25. The apparatus for fabricating semiconductor devices in accordance with claim 23, further comprising a reinforce for suppressing displacement of said support member,
said reinforce having a reinforce body being fixed to at least one of said at least two guide posts, and a screw being fitted with said reinforce body,
said screw being so fitted with said reinforce body that its forward end comes into contact with said support member.

26. The apparatus for fabricating semiconductor devices in accordance with claim 24, further comprising a reinforce for suppressing displacement of said support member,
said reinforce having a reinforce body being fixed to at least one of said at least two guide posts, and a screw being fitted with said reinforce body,
said screw being so fitted with said reinforce body that its forward end comes into contact with said support member.

27. The apparatus for fabricating semiconductor devices in accordance with claim 22, wherein said fixed mold holder, said connecting member and said support member are integrally molded with each other.

28. The apparatus for fabricating semiconductor devices in accordance with claim 22, further comprising:
a power source generating power for applying reciprocation in a direction opening/closing said fixed mold being mounted on said fixed mold holder and said movable mold being mounted on said movable mold holder to said movable mold holder,
a drive shaft being supplied with said reciprocation by said power source, and
a holder being mounted on the forward end of said drive shaft,
said holder comprising:
a mounting plate being fixed to said forward end of said drive shaft,
a lever being rotatably supported on a side of said mounting plate being opposite to said drive shaft, and
an elastic body urging said lever to rotate the same toward said mounting plate,
said apparatus further comprising a connecting member being fixedly connected to said movable mold holder and connectable with said holder by being held by said mounting plate and said lever therebetween so that movement of said drive shaft in a direction closing said movable mold and said fixed mold is transmitted to said connecting member through said mounting plate and movement in a direction for releasing the same is transmitted to the same through said lever, said elastic body urging said lever with force being sufficient for regularly maintaining said mounting plate in contact with said connecting member in reciprocation of said drive shaft.

29. The apparatus for fabricating semiconductor devices in accordance with claim 28, wherein said support member is provided with an opening being capable of freely receiving said drive shaft.

30. The apparatus for fabricating semiconductor devices in accordance with claim 29, wherein said opening is formed in a shape being capable of passing said holder being connected with said connecting member therethrough.

31. The apparatus for fabricating semiconductor devices in accordance with claim 22, wherein said fixed mold holder is provided with a first groove being engageable with said fixed mold, said fixed mold being engaged with said first groove is fixed to said fixed mold holder by a detachable fastening member, said movable mold holder is provided with a second groove being engageable with said movable mold, and said movable mold being engaged with said second groove is fixed to said movable mold holder by a detachable fastening member.

* * * * *